(12) United States Patent
Watanabe

(10) Patent No.: US 7,248,197 B2
(45) Date of Patent: Jul. 24, 2007

(54) A/D CONVERTER THAT IS IMPLEMENTED USING ONLY DIGITAL CIRCUIT COMPONENTS AND DIGITAL SIGNAL PROCESSING

(75) Inventor: Takamoto Watanabe, Nagoya (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 11/442,127

(22) Filed: May 30, 2006

(65) Prior Publication Data

US 2006/0290555 A1     Dec. 28, 2006

(30) Foreign Application Priority Data

Jun. 27, 2005   (JP)   ............................. 2005-186850

(51) Int. Cl.
*H03M 1/60*     (2006.01)
(52) U.S. Cl. ...................... 341/157; 341/155; 341/166; 377/42
(58) Field of Classification Search ................ 341/157; 377/42
See application file for complete search history.

(56) References Cited

U.S. PATENT DOCUMENTS

| | | | |
|---|---|---|---|
| 5,396,247 A | 3/1995 | Watanabe et al. | |
| 5,534,809 A * | 7/1996 | Watanabe et al. | ........... 327/269 |
| 5,828,717 A * | 10/1998 | Kusumoto et al. | ............ 377/24 |
| 5,999,586 A * | 12/1999 | Terada et al. | .................. 377/20 |
| 6,771,202 B2 | 8/2004 | Watanabe et al. | |
| 6,879,278 B2 | 4/2005 | Watanabe et al. | |

FOREIGN PATENT DOCUMENTS

| | | |
|---|---|---|
| JP | H05-259907 | 10/1993 |
| JP | 2004-007385 | 1/2004 |
| JP | 2004-357030 | 12/2004 |

\* cited by examiner

*Primary Examiner*—Khai M. Nguyen
(74) *Attorney, Agent, or Firm*—Posz Law Group, PLC

(57) ABSTRACT

A TAD (time analog/digital) type of A/D converter has plural series-connected delay units each producing a delay in accordance with the level of a converter input voltage, with a first-stage delay unit receiving a pulse signal at commencement of each A/D conversion sampling interval, and a latch/encoder circuit detecting the total number of delay units traversed by the pulse signal by the end of the sampling interval, to obtain a numeric value expressing the input voltage level. To ensure uniformity of the delays of the delay units, these are formed using transistors of larger size than transistors of other circuits such as the latch/encoder circuit.

14 Claims, 13 Drawing Sheets

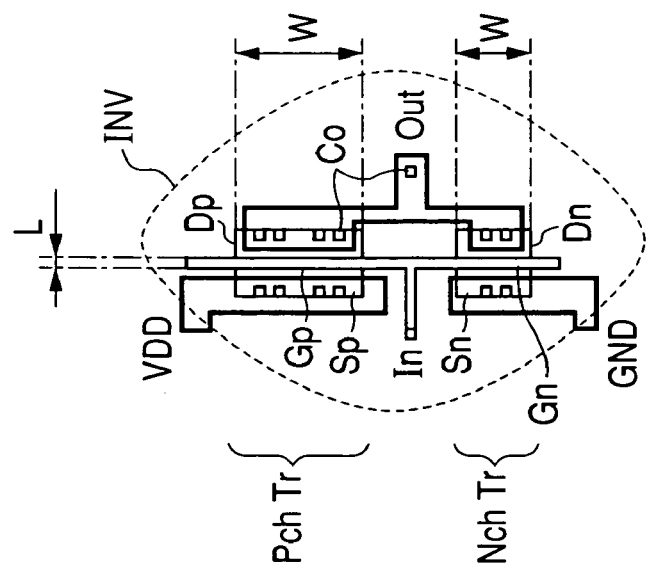
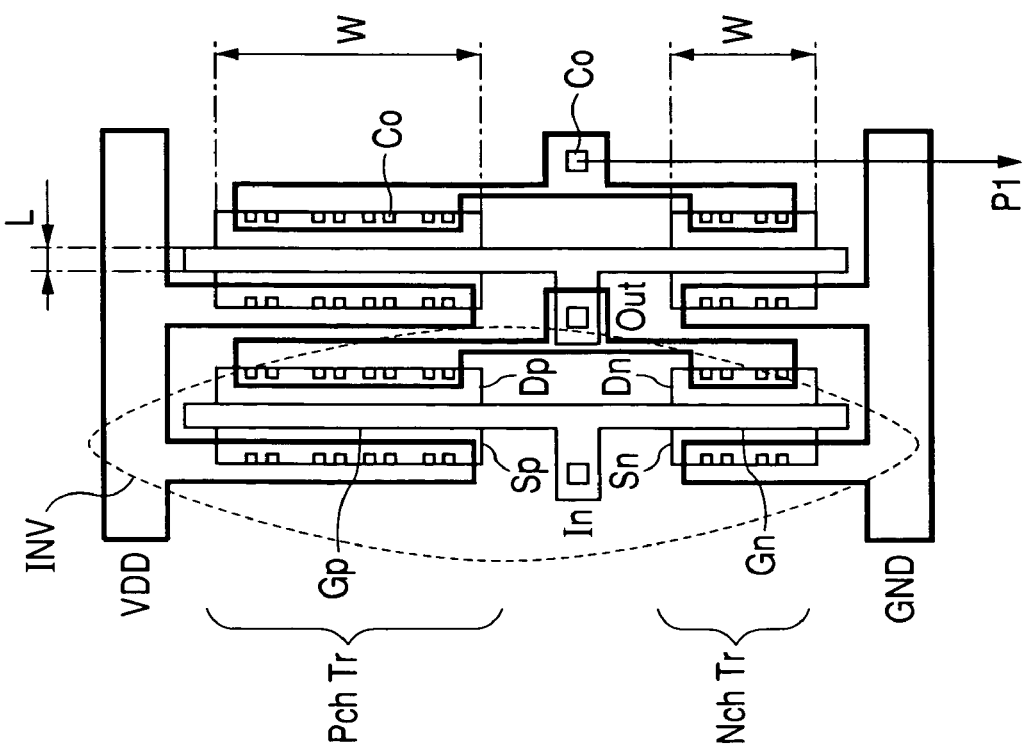
FIG. 2A
FIG. 2B

A/D CONVERTER THAT IS IMPLEMENTED USING ONLY DIGITAL CIRCUIT COMPONENTS AND DIGITAL SIGNAL PROCESSING

CROSS-REFERENCE TO RELATED APPLICATIONS

This application is based on and incorporates herein by reference Japanese Patent Application No. 2005-186850 filed on Jun. 27, 2005.

BACKGROUND OF THE INVENTION

1. Field of Application

The present invention relates to a TAD (Time Analog-to-Digital) type of A/D (Analog-to-Digital) converter, in which only digital signal processing is utilized.

2. Description of Related Art

Various TAD A/D converters have been proposed, for example as described in Japanese patent publication No. 5-259907 (referred to in the following as related document 1), in which a pulse delay circuit formed of a plurality of series-connected stages (with each stage made up of a delay unit) delays a pulse signal by an amount that is determined by the voltage level of an (analog) input signal, and in which A/D converted data are outputted as numeric values that express the voltage level of the converter input signal as the number of stages that are traversed by the pulse signal during a predetermined sampling interval. That number of stages can be measured by simultaneously registering (e.g., using latch circuits) the respective output signal values from the delay units at the end of the sampling interval, to thereby detect the position that has been reached by the pulse signal within the series of stages in the pulse delay circuit.

In addition as described in documents such as Japanese patent publication No. 2004-7385 (referred to in the following as related document 2), rather than forming the pulse delay circuit as a linear delay line formed of a set of series-connected stages, the output signal from the final delay unit is transferred to a first input terminal of the first-stage one of a set of series-connected delay units, such as to form a ring-configuration delay line, with a pulse signal being applied to an activation input terminal of the first-stage delay unit at the start of each sampling interval. In each A/D measurement operation, a circulation number counter counts the total number of times the pulse signal circulates around the pulse delay circuit during the sampling interval, while in addition the position reached by the pulse signal within the pulse delay circuit during the sampling interval is also detected, as described for related document 1 above. Each A/D converted output value is obtained as a combination of the count value attained by the circulation number counter (expressing the high-order bits of the converted output value) and a numeric value expressing the position attained by the pulse signal within the pulse delay circuit (expressing the low-order bits of the converted output value).

Another related example is described in Japanese patent publication No. 2004-357030 (referred to in the following as related document 3), whose principles are based on those of the A/D converter of related document 1 above. With that example, instead of detecting the number of delay stages that have been traversed by the pulse signal a single time in each conversion operation at the end point of a single measurement interval, that number is detected n times in succession in each conversion operation, (where n is an integer), at time points that are successively shifted by 1/n times the amount of delay that is currently being applied by each delay unit.

To define each set of successively shifted time points, it is necessary to utilize a clock signal generating circuit which produces a set of sampling clock signals that are respectively shifted in phase from one another by the aforementioned amount, and are supplied to respective ones of a set of circuits referred to as pulse position numerizing circuits, each of which obtains the position of the pulse signal, when the corresponding time point is reached. The clock signal generating circuit can be implemented as a circuit formed only of transistors, in particular, formed of CMOS inverters producing respectively predetermined amounts of delay.

With the above types of TAD A/D converters, it becomes possible to eliminate components such as operational amplifiers, capacitors, resistors, etc., that are required with a conventional type of A/D converter that must operate upon very small-amplitude analog signals. Hence, a TAD A/D converter can readily be implemented in integrated circuit form. In particular, such an A/D converter can be advantageously implemented by using CMOS integrated circuit technology.

At present, the design rule used in the manufacturing process for CMOS ICs is that the design rule in a transistor structure (i.e., minimum line width) is less than 100 nm, and sizes of 90 to 65 nm and even as small as 45 nm have been achieved. It is expected that such transistors will be made even smaller in future, and that it will soon be possible to achieve a design rule as small as 30 nm. Since TAD types of A/D converter employ only digital circuitry, they are especially suitable for being produced using such a leading-edge CMOS integrated circuit manufacturing process, with extremely small transistor sizes.

That is to say, since digital circuits perform only logical operations (AND, OR, etc.) and need only switch a signal between two levels, i.e., the "0" and "1" levels, it is not necessary to discriminate between small differences in signal level, such as a change from a "0.2" to a "0.35" level. As the size of the transistors used to constitute digital circuits is reduced, the effects of manufacturing defects (resulting in deviations of line widths from the design values) and effects of small dust particles adhering to the IC surface, will have a correspondingly greater adverse effect upon the operating characteristics of the transistors. In particular, deviations in line width that cause variations in the pattern areas of the gates of the transistors will result in differences between the respective drive capabilities of the transistors. However when the transistors constitute a digital circuit, whose input and output signals change only between the "0" and "1" levels, problems resulting from such manufacturing defects and dust, etc., are substantially avoided.

In particular, in the case of circuits produced using the latest CMOS IC manufacturing processes for micro-miniaturization, digital circuits will in general have a much greater tolerance for the effects of manufacturing defects than will analog circuits.

However when the design rule becomes extremely small, the effects of manufacturing defects and adhering dust particles cannot be ignored, even in the case of digital circuits, so that these effects will become of increasing importance in the future.

FIGS. 13A, 13B, 13C are respective explanatory diagrams, in which FIG. 13A is a pattern diagram of an inverter circuit formed of a P-channel FET (field effect transistor) and an N-channel FET formed in an IC chip, FIG. 13B is an expanded view of a P-channel FET in FIG. 13A, and FIG.

13C illustrates the effect of reducing the transistor width W and the transistor length L (i.e., the pattern width of the gate G) each by one half.

As illustrated in these diagrams, a portion of the pattern of a gate G such as gate Gp of the P-channel FET may be missing, due to manufacturing defects, so that the total effective area of that gate (i.e., the region enclosed by the drain D and source S of that transistor) is accordingly reduced. As can be readily understood from FIG. 13C, the smaller the transistor size (i.e., the smaller the transistor width W and transistor length L) the greater will become the effects of such manufacturing defects. This will have an adverse effect upon the transistor characteristics, and in particular upon the drive capability.

In order to achieve stable operation of a TAD type of A/D converter, it is necessary that the delay units of the pulse delay circuit produce respectively identical amounts of delay, so that the pulse signal will be transmitted along the successive delay units at a uniform speed during each measurement interval, as illustrated conceptually by the arrow lines in FIG. 14A. In FIG. 14A, for example, (K) corresponds to the time at which the pulse signal is outputted from the k-th delay unit, after successively traversing the first to k-th delay units.

However if there are small differences between the respective levels of drive capability of the transistors constituting the delay units, due to the effects of manufacturing defects and adhering dust particles, etc., then deviations will occur between the respective delay times of the delay units. This is conceptually illustrated in FIG. 14B, and it can be understood that this will result in deviations in the resolution of the A/D converted data. The resolution expresses the amount of change in level of the converter input voltage that will result in a corresponding change in the LSB (least significant bit) of the A/D converted data. It can be seen that this will result in the resolution varying in accordance with the level of the converter input signal, i.e., there will be large amounts of differential non-linearity.

In the case of the A/D converter of related document 2 above, it is necessary that each operation for detecting the position of the pulse signal within the pulse delay circuit, at the end of a measurement interval be performed while also correctly obtaining the count of total number of circulations from the circulation number counter This is necessary in order for the high-order bits (counter data) and low-order bits (pulse delay position data) of each A/D converted value to be matched. For that reason, a single timing signal is used to control latching of the circulation number counter data and pulse delay position.

The circulation number counter is generally a synchronous type of counter. As the number of bits constituting the count value is increased, the amount of load imposed on a clock signal supply line of the counter will increase accordingly. This increase in load results in a delay in operation of the circulation number counter, which results in problems.

The clock signal supplied to the circulation number counter is the output signal from a specific one of the delay units, in general, the final-stage delay unit. At a time point when the respective outputs of the delay units are latched to find the position reached by the pulse signal within the series of delay units, and the count value of the circulation number counter is also registered by a latch circuit, the aforementioned delay in operation of the circulation number counter may result in the count value being registered before it has been incremented by the most recent occurrence of outputting of the delayed pulse signal from the pulse delay circuit. In such a case, the high-order bits and low-order bits of the resultant A/D converted value will not correctly match, so that an accurate value will not be obtained.

Due to the above problem, it is necessary to insert a supply line drive buffer circuit for transferring the output from the final-stage delay unit to the circulation number counter. Accordingly, it is also necessary to insert a delay buffer circuit for supplying the latch timing signal to the counter latch circuit, in order to compensate for (i.e., balance) the delay introduced by the supply line drive buffer circuit.

However with increasing degrees of miniaturization of IC components, so that manufacturing defects and adhering dust particles result in greater deviations between the drive capabilities of respective transistors that constitute the delay buffer circuit and the supply line drive buffer circuit, it becomes increasingly difficult to achieve accurate matching of the respective amounts of delay that are introduced by these circuits. Hence, it becomes increasingly difficult to ensure that the high-order bits and low-order bits of each A/D converted value are correctly matched, so that accurate A/D converted data may not be obtainable.

In the case of the A/D converter of the related document 3 above, designating the delay time of a delay unit as $\Delta t$, it is necessary for the respective pulse position numerizing circuits to accurately use (in each A/D conversion operation) measurement intervals (sampling intervals) which respectively differ by a unit time amount $\Delta t = Td/n$, where Td is the amount of delay that is currently being produced by each of the delay units under the currently applied level of converter input voltage. As a result, it is necessary to generate sampling clock signals that are successively shifted in phase by the unit time interval $\Delta t$.

To generate such sampling clock signals, a total of n CMOS inverter circuits are utilized, each of which receives a reference clock signal, and the respective sizes of the transistors in the inverter circuits are adjusted such as to produce specific small differences in the switching voltage levels (and hence, in the signal level inversion timings) of the respective inverter circuits, such that the output signals from the inverter circuits will respectively differ in phase by the unit time amount $\Delta t$.

Hence, with such a clock signal generating circuit, if small differences occur between the respective drive capabilities of the transistors that constitute the clock signal generating circuit (i.e., due to the effects of manufacturing defects and adhering dust particles), it becomes impossible to accurately shift the phase by precise units of $\Delta t$. Thus, the resolution of A/D conversion will be lowered and the differential non-linearity will become large, since the A/D converted data are obtained by adding together the outputs from the respective pulse position numerizing circuits.

SUMMARY OF THE INVENTION

It is an objective of the present invention to overcome the above problems of the related art, by providing a TAD type of A/D converter having stable characteristics, with a low level of differential non-linearity of A/D conversion, and whereby a reduction can be achieved of adverse effects of manufacturing defects and adhering dust particles that result from a CMOS IC manufacturing process providing increased miniaturization of IC components.

To achieve the above objectives, according to a first aspect, an A/D converter according to the present invention, for converting the level of an (analog) converter input voltage to an output digital numeric value in each of successive conversion operations, comprises:

(a) a pulse delay circuit, formed of a plurality of delay units connected as successive delay stages, with a first-stage one of the delay units receiving an externally supplied pulse signal at commencement of each of respective measurement intervals (i.e., respective A/D conversion sampling intervals), with the converter input voltage being applied to control each of the delay units, and each of the delay units transferring the pulse signal with an amount of delay that varies in accordance with the level of the converter input voltage, and (b) encoder circuit means for receiving the respective outputs of the delay units and detecting a total number of the delay stages that have been traversed by the pulse signal up to the end of a measurement interval, and thereby deriving at least a set of low-order bits of the output digital value.

Each of the pulse delay circuit and the encoder circuit means is made up of transistors, which would typically be CMOS FETs, connected as CMOS inverters. To minimize differential non-linearity, the delay units should uniformly produce identical amounts of delay, in accordance with the converter input voltage level. That delay is determined by the operating characteristics of the transistors, in particular, the characteristics of the FETs of CMOS inverters. For that reason each of the transistors of the pulse delay circuit is preferably formed with a larger size than transistors constituting specific other sections of the A/D converter. These specific other sections include at least part of the encoder circuit means.

By forming the transistors of the pulse delay circuit to be of sufficiently large size, (in particular, in the case of CMOS FETs, to have a sufficiently large area of gate electrode), the respective pulse delay intervals of the delay units in the pulse delay circuit can be made accurately uniform, so that variations in the A/D conversion resolution as a result of changes in the level of the converter input voltage can be reduced, i.e., the amount of differential non-linearity of A/D conversion can be reduced.

That is to say, since the transistors that constitute the delay units are made larger in size than the transistors of other circuit sections, the operation of the delay units can be made less susceptible to the effects of manufacturing defects (in particular, deviations that result in size variations of the gate areas of transistors) and adhering dust particles than is the case when the transistors of the delay units are formed of smaller size.

The delay units can thereby have operating characteristics that are in accordance with design requirements, so that the respective amounts of delay provided by the delay units can be accurately matched.

In addition, as a further result of forming the transistors of the delay units with an appropriately large size, the manufacturing yield can be increased.

However since the number of transistors constituting the pulse delay circuit is not large in relation to the total number of transistors of the A/D converter, the amount of area in an IC chip that is occupied by the pulse delay circuit is not substantially increased as a result of increasing the size of the transistors of the pulse delay circuit. Hence, the A/D converter can be kept compact in size.

The pulse delay circuit may simply consist of a linear succession of delay stages, in which case all of the bits of the output digital numeric value (i.e., A/D conversion result) are derived by the encoder circuit means from the total number of delay stages that are traversed by the pulse signal up to the end of the measurement interval.

Alternatively, the A/D converter may be configured with the pulse delay circuit formed as a ring delay line, i.e., with the output from the final-stage delay unit being appropriately fed back to the input-stage delay unit, so that after a pulse signal inputted to the first-stage delay unit it will continue to circulate around the pulse delay circuit during the subsequent measurement interval. In that case, the A/D converter further comprises:

(a) a counter circuit, having a count input terminal for receiving the (delayed) pulse signal from the output of a specific one of the delay units (normally, the output of the final-stage delay unit), to thereby obtaining a count of the number of times that the pulse signal circulates around the pulse delay circuit during the measurement interval, and (b) a latch circuit for registering the count value of the counter circuit in response to an externally supplied latch timing signal, supplied at the end of the measurement interval, and for deriving a set of high-order bits of the output digital numeric value from the count value, and (c) a first buffer circuit for transferring the delayed pulse signal from the specific one of the delay units to the count input terminal of the counter circuit, and a second buffer circuit for transferring the latch timing signal to the latch circuit of the counter.

As described above, the clock signal input terminal of a counter circuit has a high value of input capacitance, so that a high level of drive current is necessary to ensure stable operation of the counter. Hence it is preferable to transfer the output from a delay unit to that clock input terminal through a buffer circuit. However the signal transmission delay through the buffer circuit is significant. Hence, if the count value of the counter were to be latched simultaneously with latching the respective outputs from the delay units at the end of each measurement interval, an incorrect count value might be registered, so that the high-order bits and low-order bits of the resultant output numeric value would not be correctly coordinated.

By incorporating a second buffer circuit to supply the latch control signal of the latch circuit of the circulation number counter, the delay in latching the count value can be compensated. However to achieve this, it is necessary that each of the first and second buffer circuits be configured to produce the same predetermined amount of signal transmission delay. It can thereby be ensured that when the latch timing signal acts to register the outputs from each of the delay units, and also the count value of the circulation number counter, the count value will not be prematurely registered, so that accurate A/D converted data can be obtained.

With such a configuration, in order to enable the respective amounts of signal transmission delay produced by the first and second buffer circuits to be accurately matched, the transistors constituting these buffer circuits are preferably formed with a larger size than the transistors of other parts of the A/D converter, i.e., parts where it is unnecessary for accurate amounts of transmission delay to be set.

From another aspect, the encoder circuit means can comprise:

(a) a sampling clock signal generating circuit, controlled by the converter input voltage for generating n sampling clock signals which respectively differ in phase from one another by an amount equal to 1/n times an amount of delay that is currently being applied by each of the delay units, where n is an integer of value 2 or greater, (b) n pulse position numerizing circuits each coupled to the pulse delay circuit and responsive to a specific corresponding one of the sampling clock signals for repetitively defining corresponding measurement intervals, with respective corresponding measurement intervals of the pulse position numerizing circuits successively differing in duration by 1/n times the amount of delay of each of the delay units, and each of the pulse position numerizing circuits operating during each of the corresponding measurement intervals to derive a numeric value expressing a total number of the delay stages that are traversed by the pulse signal during the corresponding measurement interval, and (c) an adder circuit, for adding together respective numeric values derived by the pulse position numerizing circuits, and for deriving the bits of the output digital value from a result of the addition.

Such a configuration enables the A/D conversion resolution to be increased by a factor of n times, i.e., n times the resolution of a single one of the pulse position numerizing circuits. However it is essential that the pulse position numerizing circuits have respectively identical value of conversion resolution. To achieve this, it is necessary for accurate clock signals to be produced by the sampling clock signal generating circuit, so that the transistor constituting that circuit should have accurately predetermined characteristics. Hence each of the transistors of the sampling clock signal generating circuit is preferably formed with a larger size than transistors constituting specific other parts of the encoder circuit means.

From another aspect, an A/D converter according to the present invention can comprise a set of buffer circuits each coupled between the output of a corresponding one of the delay units and a corresponding input terminal of the encoder circuit means, for transferring the pulse signal to the encoder circuit means. Each of the buffer circuits has a predetermined uniform level of drive capability, where "drive capability" signifies a level of output current that can be supplied by the buffer circuit without increasing the amount of signal transmission delay beyond a predetermined amount. This is preferably ensured by forming the transistors constituting these buffer circuits of larger size than the transistors constituting specific other sections of the A/D converter.

In particular, the transistors constituting these buffer circuits are preferably made intermediate in size between the transistors of the delay units and the transistors of the aforementioned specific other sections of the A/D converter.

By incorporating that set of buffer circuits, deviations between the respective switching levels of inverters that constitute the pulse delay circuit and inverters in the encoder circuit can be kept smaller than the quantization step size, so that stable operation can be achieved. The term "switching level" is used here to signify the level of converter input voltage to an inverter at which the output voltage of the inverter will change from a high to a low level, or vice-versa.

In particular, when the encoder circuit means includes of a plurality of pulse position numerizing circuits as described above, by connecting each of these buffer circuits between an output of a corresponding delay unit in the pulse delay circuit and a corresponding input terminal in each of the pulse position numerizing circuits, the drive capacity of the delay buffers can be augmented sufficiently. This not only ensures stable operation of the encoder circuit means, but also can prevent instability of operation of the pulse delay circuit.

BRIEF DESCRIPTION OF THE DRAWINGS

FIG. 2A shows an example of an IC pattern of the CMOS inverters of a delay unit of FIG. 1B, and FIG. 2B shows a corresponding example of an IC pattern of a CMOS inverter, for use in a part of the A/D converter in which accurately predetermined delay characteristics are not required for the inverter;

FIG. 3A shows an IC pattern of another example of a CMOS inverter for use in a delay unit of the first embodiment, having a comb-shaped gate electrode, while

DESCRIPTION OF PREFERRED EMBODIMENTS

First Embodiment

Figure 1A:
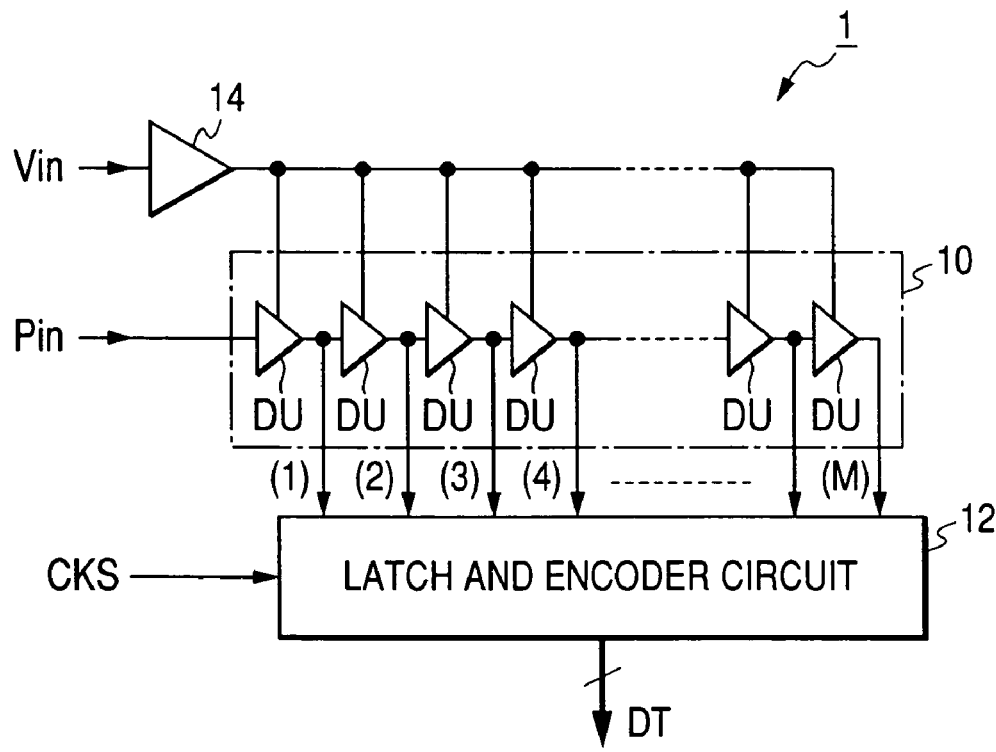
FIG. 1A is a system block diagram showing the general configuration of a first embodiment of an A/D converter.

FIG. 1A shows the overall configuration of an embodiment of a TAD type of A/D converter, designated by reference numeral 1. The A/D converter 1 is formed of a pulse delay circuit 10, a latch and encoder circuit 12 and a buffer circuit 14. The pulse delay circuit 10 is made up of a plurality n (where n is an integer) of delay units DU which are connected in series, to constitute respective successive delay stages that are indicated as (1), (2), (3), etc., in FIG. 1. Each of the delay units DU delays the input signal applied thereto by an amount that is substantially the same for each delay unit, as described hereinafter. As shown, the first-stage delay unit DU receives as input a pulse signal Pin from an external source, made up of successive pulses each of which is generated at the start of an A/D conversion sampling interval. An converter input voltage Vin is supplied via the buffer 14 to each of the delay units DU, while respective output voltages from the delay units DU are supplied to the latch and encoder circuit 12. A sampling clock signal SKS is supplied from an external source to the latch and encoder circuit 12, for determining the successive sampling intervals. The latch and encoder circuit 12 includes a plurality of latch circuits (not shown in the drawings) for respectively receiving the output signals from the delay units DU. During operation of the A/D converter 1, at the end of each sampling interval, the latch and encoder circuit 12 latches the latch and encoder circuit 12 latches the output values from the delay units DU, and detects the one of the delay units which is outputting the pulse signal Pin at that point in time, to thereby detect the position reached by the pulse signal Pin within the pulse delay circuit 10.

The latch and encoder circuit 12 then converts such a detection result into a digital value having a predetermined number of bits, expressing the one of the delay stages (1) to (M) that has been reached by the pulse signal Pin in passing sequentially through the delay units of the pulse delay circuit 10, starting from the leading delay unit DU. The successive digital values thereby obtained constitute the output A/D converted data from the A/D converter 1, designated as DT.

Figure 1B:
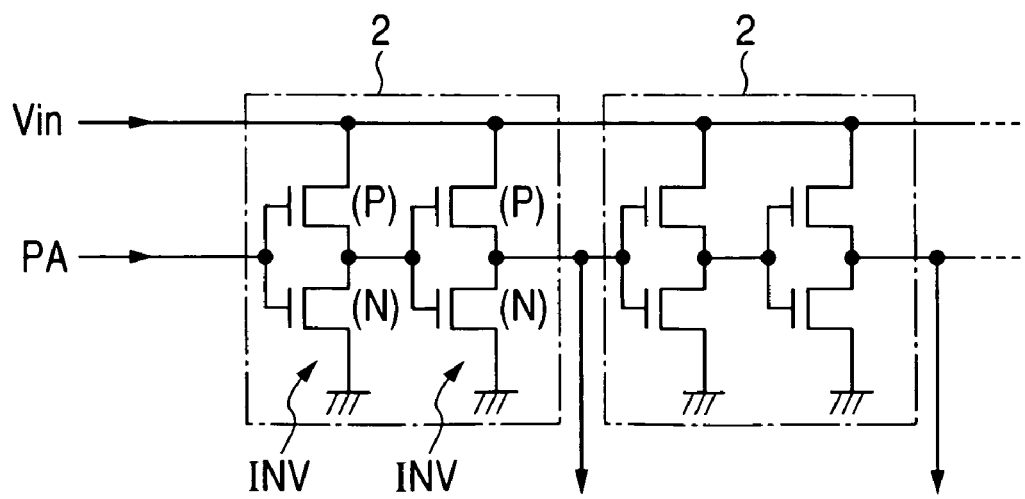
FIG. 1B is a circuit diagram showing an example of delay units of the first embodiment, each formed of two CMOS inverters.

FIG. 1B shows an example of the configuration of each delay unit DU of this embodiment, with the internal circuit of a delay unit being designated by reference numeral 2. As shown, each delay unit is made up of two CMOS FET (complementary metal-oxide semiconductor field-effect transistor) inverters INV connected in series, with each inverter acting as a buffer and also applying a specific amount of delay (in accordance with the level of the converter input voltage Vin) to an input signal before outputting the signal.

Each inverter consists of a P-channel FET and N-channel FET, with the source electrode of the P-channel FET coupled to received the converter input voltage Vin from the output of the buffer circuit 14 (i.e., the analog signal voltage that is the object of D/A conversion), the drain electrodes of the P-channel FET and N-channel FET connected together and constituting the output terminal of the inverter, the source electrode of the N-channel FET connected to the ground potential, and the gate electrodes of the P-channel FET and N-channel FET connected together to constitute the input terminal of the inverter.

The delay produced by each delay unit DU is inversely proportional to the level of the converter input voltage Vin. The number (M) of delay stages is determined based on the maximum level that can be attained by the converter input voltage Vin.

Specifically, following inputting of a pulse of the pulse signal Pin to the pulse delay circuit 10, when the next rising edge of the sampling clock signal CKS occurs, the output levels from the delay units DU are latched by the latch and encoder circuit 12 to thereby determine the position reached by the pulse signal Pin along the successive delay stages of the pulse delay circuit 10, and that position information is then converted into a numeric (digital) value expressing the current level of the converter input voltage Vin, with that digital value then being outputted as A/D converted data DT.

With this embodiment, the A/D converter 1 is implemented as a semiconductor IC that is manufactured using CMOS technology. The latch and encoder circuit 12 is constituted by transistors that are of minimum possible size, i.e., manufactured using the smallest practicable design rule in the current state of technology, for example with a line width of 90 nm. However it is a specific feature of this embodiment that the pulse delay circuit 10 of the A/D converter 1 is formed with transistors that are of larger size than those of the latch and encoder circuit 12. Specifically, the transistors of the pulse delay circuit 10 are made to be of sufficient size to ensure that uniform amounts of delay will be produced by the respective delay units DU, i.e., to ensure that for any particular level of the converter input voltage Vin, substantially identical amounts of delay will be produced by each the delay units, irrespective of the effects of manufacturing defects, in particular, defects which affect the size of gate electrodes in the FETs of the delay units.

FIG. 2A is a diagram showing the IC pattern of a delay unit DU of the pulse delay circuit 10 (as formed in an IC chip), made up of two CMOS FET inverters connected in series, while FIG. 2B similarly shows the pattern of a CMOS FET inverter within the latch and encoder circuit 12. In each inverter, the transistor width W of the P-channel FET is made greater than that of the N-channel FET, in order to ensure that the P-channel FET and MOS FET will have identical levels of drive capability.

As shown in FIG. 2A, the transistors of the pulse delay circuit 10 each have a transistor length L which is twice the transistor length L of the transistors of the latch and encoder circuit 12. Specifically, the transistor length L of a transistor of the pulse delay circuit 10 is twice the minimum line width. In addition, the transistor width W of each transistor of the pulse delay circuit 10 is twice that of each transistor of the latch and encoder circuit 12. The larger size of the transistors in the pulse delay circuit 10 ensures that a sufficiently high level of drive capability can be achieved for these transistors. However the size of each contact window Co at which contact is established in the line pattern is made as small as possible, in both the transistors of the latch and encoder circuit 12 and also those of the pulse delay circuit 10, and the pattern widths of the drain electrodes Dp, Dn and source electrodes Sp, Sn (each of which is designed to be larger than the size of the contact windows that are formed in that pattern portion) are also made as small as possible, in both the transistors of the latch and encoder circuit 12 and also those of the pulse delay circuit 10.

Due to the fact that the transistors of the pulse delay circuit 10 are made larger than those of other circuit sections of the A/D converter 1 such as the latch and encoder circuit 12 (more specifically, are made larger than the minimum size that is practicable in the present state of CMOS IC manufacturing technology), it can be ensured that only small variations occur in the pattern areas of the gate electrodes of the transistors of the pulse delay circuit 10 as a result of the effects of manufacturing defects and adhering dust particles, etc. Hence, the required design characteristics, and in particular the design values of drive capability, can be achieved for these transistors.

As a result, the delay characteristics of the transistors of the pulse delay circuit 10 can be made uniform, i.e., it can be ensured that at any specific level of the converter input voltage Vin, the inverters INV formed of these transistors will produce substantially identical values of delay. Hence, the resolution of the A/D converted data DT will not vary by more than a small amount as the converter input voltage Vin is varied, i.e., the amount of differential non-linearity will be small. Furthermore, the manufacturing yield of the D/A converter ICs is increased.

Moreover, the circuitry of pulse delay circuit 10 occupies a substantially smaller amount of chip area than does that the latch and encoder circuit 12. Hence, the overall circuit scale of the A/D converter 1 is not significantly increased as a result of making the transistors of the pulse delay circuit 10 larger in size, so that the D/A converter IC chip can be made extremely compact.

The contact windows of the transistors of the pulse delay circuit 10 are made as small as possible, i.e., by applying a minimum size of design rule, consistent with avoiding adverse effects such as non-linearity of the transistor characteristics. The pattern areas of the each of the drain electrodes Dn and source electrodes Sn can thereby be made small in relation to each of the pattern areas of the gate electrodes Gp, Gn. In that way, the size of the transistor is increased (in relationship to the minimum practicable size) by no more than is necessary, and the drain capacitance of each transistor (which is proportional to the pattern area of the drain electrodes Dp, Dn) can be kept small, so that the drive capability of the transistor is not lowered due to an increased amount of drain capacitance. As a result, the operating speed of each of the transistors constituting the delay units DU can be made high, and the resolution of A/D conversion can be high.

With this embodiment, since the transistor length L and the transistor width W of each transistor of the pulse delay circuit 10 are each made large, a requisite amount of pattern area can be obtained for each of the gate electrodes Gn, i.e., sufficient to ensure that the effects of manufacturing defects and adhering dust particles will not significantly affect the performance of the pulse delay circuit 10.

Figure 3A:
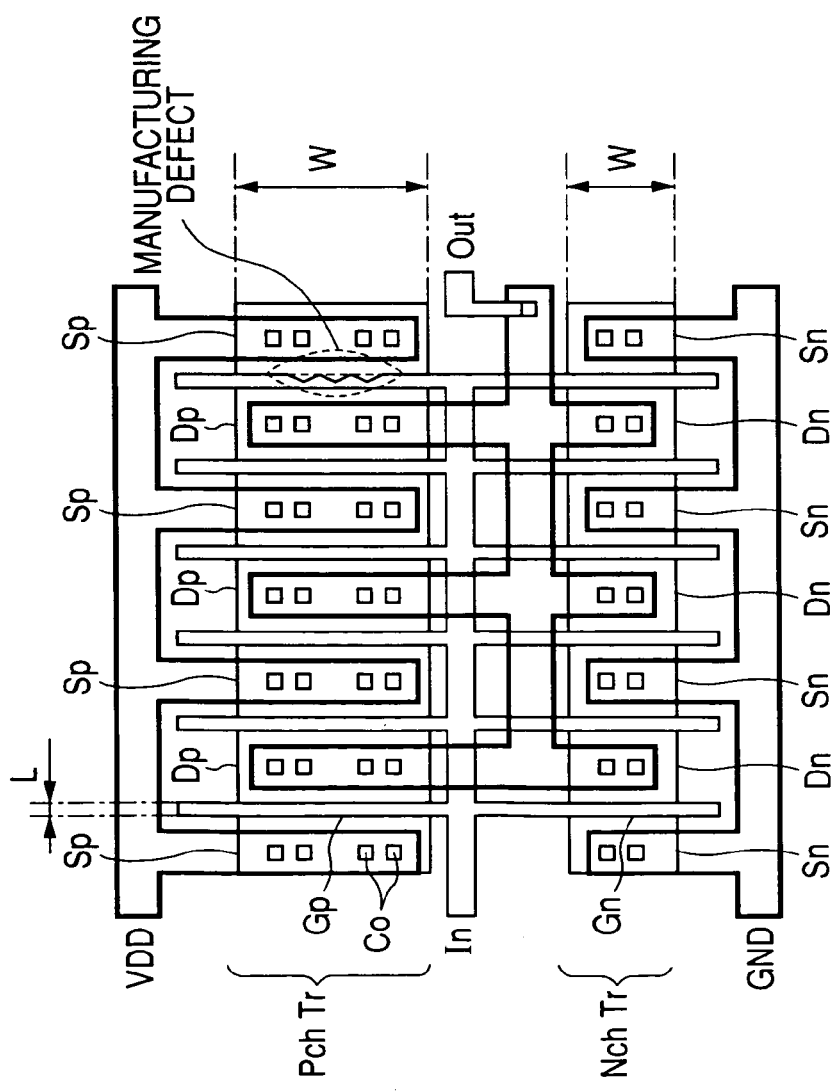
Figure 3B:
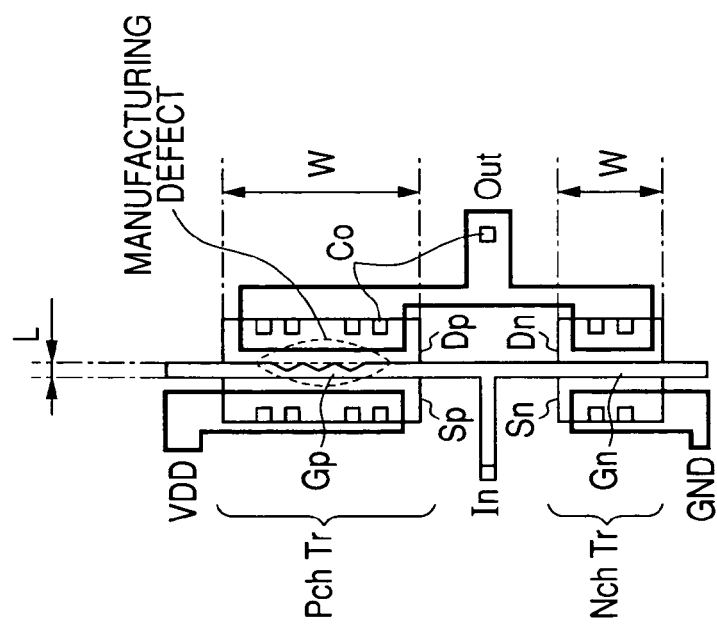
FIG. 3B shows a corresponding example of an IC pattern of a CMOS inverter, for use in a part of the A/D converter in which accurately predetermined delay characteristics are not required for the inverter.

FIGS. 3A, 3B show alternative IC patterns for the transistors of the A/D converter 1, with FIG. 3A showing the pattern of a transistor of a delay unit DU in the pulse delay circuit 10 and FIG. 3B showing the pattern of a CMOS FET inverter used in the latch and encoder circuit 12. In this case, a single comb-shaped electrode constitutes the respective gate electrodes of the P-channel FET and the N-channel FET of the inverter. Specifically, the comb-shaped electrode is formed as shown with an elongated spine portion, with pairs of tooth portions extending from opposing sides of the spine portion. As shown, the tooth portions on one side of the spine portion constituting respective sections of the gate electrode Gp of the P-channel FET, while the tooth portions on the opposite side of the spine portion constituting respective sections of the gate electrode Gn of the N-channel FET.

A source region and a drain region (Sp, Dp or Sn, Dn) of the corresponding FET are located at opposing sides of each of these gate electrode sections. The transistor length dimension L (i.e., the pattern width of each of the sections of the gate electrodes Gp, Gn) is the minimum practicable line width.

It will be understood that the sizes of the transistors of such a CMOS inverter can be readily increased as required, simply by increasing the number of pairs of tooth portions (i.e., opposing gate electrode sections), and the associated drain and source regions.

As illustrated in FIG. 3A, a manufacturing defect which results in the size of a gate electrode section (tooth portion of the comb-shaped structure) becoming smaller than the design value will only affect one part of the gate electrode of a transistor of the pulse delay circuit 10. However as illustrated in FIG. 3B, with the minimum practicable line width again being utilized as the transistor L dimension, such a manufacturing defect can significantly reduce the effective gate size of a transistor used in the latch and encoder circuit 12, which is not configured with the comb-shaped gate shape.

Since the transistor length L of each transistor of the pulse delay circuit 10 can be made small, a high speed of operation can be achieved for these transistors, while at the same time a sufficiently large pattern area can be provided for the gate electrodes Gn, Gp, to ensure that manufacturing defects and adhering dust particles will not significantly affect the performance of the pulse delay circuit 10.

Second Embodiment

Figure 4:
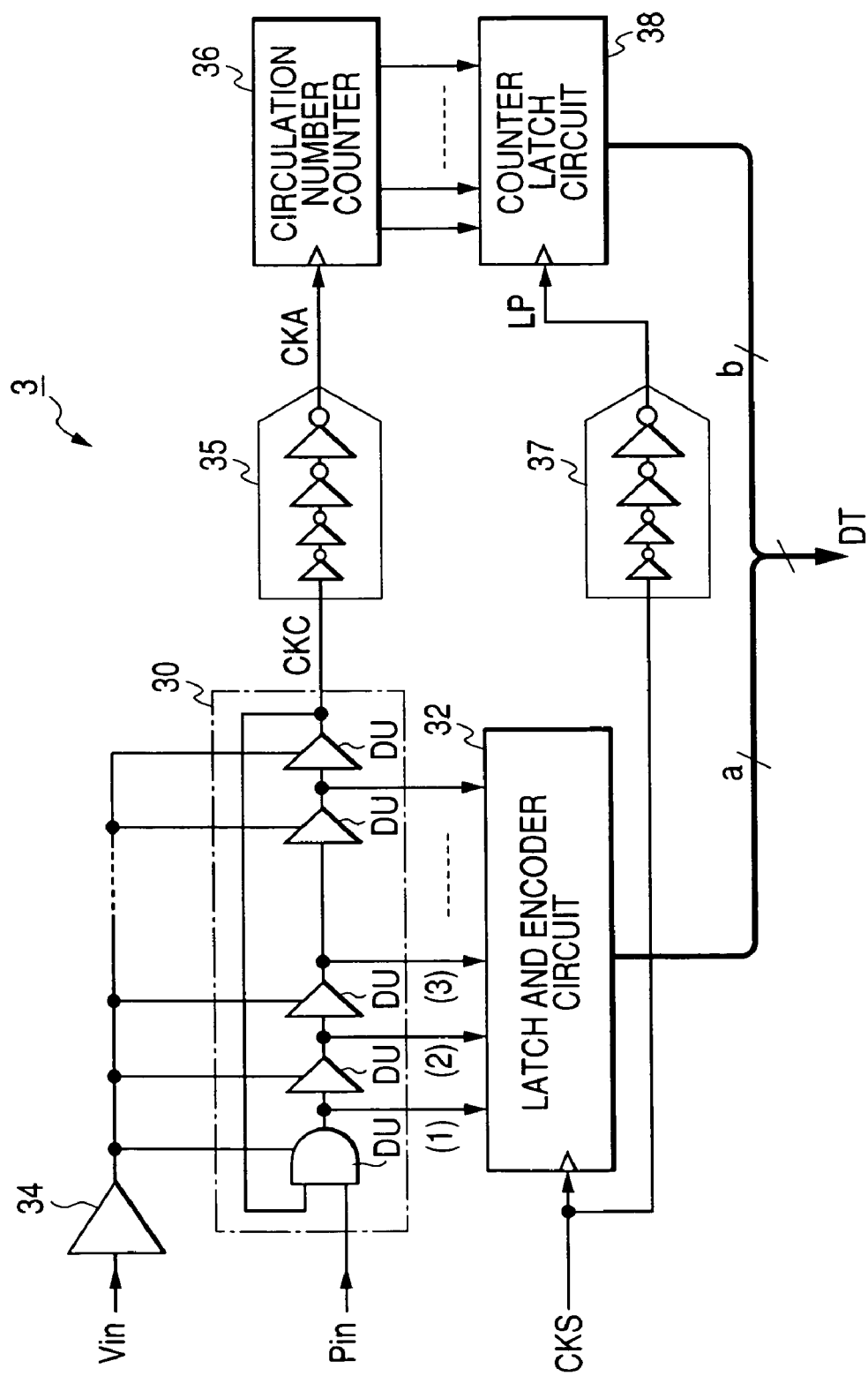
FIG. 4 is a general system block diagram of a second embodiment of an A/D converter, in which a pulse delay circuit is connected to form a ring delay line.

FIG. 4 shows the overall configuration of a second embodiment of an A/D converter, designated by reference numeral 3. The A/D converter 3 includes a pulse delay circuit 30 and a latch and encoder circuit 32, with the pulse delay circuit 30 having M delay units (where M is a $2^m$, with m being an integer). The second embodiment further includes a drive buffer circuit 35, a circulation counter circuit 36, a delay buffer circuit 37 and a counter latch circuit 38.

In the same way as for the pulse delay circuit 10 of the first embodiment, each of the delay units of the pulse delay circuit 30 receives the converter input voltage Vin from the buffer circuit 14 and applies a specific amount of delay, in accordance with the level of the converter input voltage Vin, with each of the delay units applying the same delay amount. However the initial-stage delay unit of the pulse delay circuit 30 is configured to function as a 2-input AND gate, while each of the remaining delay units DUs functions as an inverter (i.e., is formed of an odd number of series-connected CMOS inverters). Each of the CMOS inverters can be can be configured as described above referring to FIG. 2A or FIG. 3A for the first embodiment.

The initial-stage delay unit $DU_i$ has an activation input terminal that receives the pulse signal Pin, while the output from the final-stage delay unit DU is applied to the other input terminal, so that the pulse delay circuit 30 operates as a ring-configuration delay line. In each sampling interval (measurement interval), the pulse signal Pin circulates around this ring-configuration delay line a total number of times that is determined by the level of the converter input voltage Vin.

It should be noted that FIG. 4 is not intended to provide a detailed circuit diagram of the pulse delay circuit 30, and also that various other configurations are possible for forming such a ring-configuration delay line, for example with the first-stage delay unit operating as a NAND gate instead of an AND gate.

At the end of each sampling interval, having a predetermined duration Ts that is determined by the sampling clock signal CKS, the latch and encoder circuit 32 latches the respective output levels of the delay units of the pulse delay circuit 30, to thereby detect the position reached 0 by the Pin pulse within the pulse delay circuit 30 (i.e., the number of delay units that have been traversed by the pulse, counting from the initial-stage delay unit $DU_i$) at that point, and derives from that position information the low-order bits of an A/D conversion value.

The circulation counter circuit 36 is a b-bit synchronous counter (where b is an integer) which counts in accordance with an operating clock signal CKA that is supplied from the drive buffer circuit 35. The latch circuit 38 latches the count value attained by the circulation counter circuit 36 (i.e., with the counting having commenced at the start of a sampling interval), at each rising edge of a latch pulse signal LP that is outputted from the delay buffer circuit 37. The drive buffer circuit 35 receives the output produced from the final-stage delay unit of the pulse delay circuit 30, with that output being referred to as the circulation clock signal CKC, and transfers that as the operating clock signal CKA to a clock signal input terminal of the circulation counter circuit 36. The delay buffer circuit 37 receives the sampling clock signal CKS corresponding to the sampling clock signal of the first embodiment) and transfers that signal as the latch pulse signal LP to the latch circuit 38.

The drive buffer circuit 35 consists of a plurality of series-connected stages, each being a CMOS inverter, with the final-stage inverter of the drive buffer circuit 35 having sufficient drive capability in relation to the input capacitance of the clock signal input terminal of the circulation counter circuit 36 (i.e., of a control signal supply line within the circulation counter circuit 36). Each of the other inverters of the drive buffer circuit 35 is designed to have sufficient drive capability to drive the inverter of the succeeding stage.

The delay buffer circuit 37 has the same configuration and number of stages as the drive buffer circuit 35, so that the delay produced by the delay buffer circuit 37 is identical to that produced by the drive buffer circuit 35.

With this embodiment, the latch and encoder circuit 32 operates in the same manner as for the latch and encoder circuit 12 of the first embodiment. Beginning from the start of a sampling interval, the circulation counter circuit 36 counts the number of complete circulations of the pulse signal Pin around the ring-configuration delay line of the pulse delay circuit 30, based on the operating clock signal CKA. Following the end of the sampling interval, the latch circuit 38 is controlled by the latch pulse signal LP to latch the count value that has been attained by the circulation counter circuit 36.

Since the operating clock signal CKA is transmitted to the circulation counter circuit 36 via the drive buffer circuit 35, even if the number of counter stages in the circulation counter circuit 36 is large (i.e., the number of bits of the count value is large), so that the capacitance of the clock signal supply line of the drive buffer circuit 35 is high, stable operation can be ensured.

However the operating clock signal CKA is delayed by a certain amount in relation to the circulation clock signal CKC, due to being transmitted through the drive buffer circuit 35. For that reason, the sampling clock signal CKS is delayed by the same amount (in the delay buffer circuit 37), to become the latch pulse signal LP that is supplied to the latch circuit 38, i.e., the delay of the operating clock signal CKA with respect to the circulation clock signal CKC is identical to the delay of the latch pulse signal LP with respect to the sampling clock signal CKS.

In that way, the respective operations of latching the set of outputs from the pulse delay circuit 30, by the latch and encoder circuit 32, and latching the count value of the circulation counter circuit 36, by the latch circuit 38, can be appropriately coordinated. With this embodiment, the A/D converter 3 produces each A/D converted value as a set of low-order bits from the latch and encoder circuit 32, indicated as $B_L$ and a set of high-order bits, indicate as $B_H$, to constitute the output data DT expressing the level of the converter input voltage Vin.

The A/D converter 3 is implemented on an IC chip using the CMOS manufacturing process, in the same manner as for the first embodiment. The transistors of the circulation counter circuit 36 and latch circuit 38, as well as those of the latch and encoder circuit 32, are each made as small in size as possible, i.e., formed by using the minimum practicable design rule. The transistors of the pulse delay circuit 30 are made of larger size than those of the latch and encoder circuit 32, circulation counter circuit 36 and latch circuit 38, for the same reasons as described above for the first embodiment. However in addition, with the second embodiment, the transistors of the drive buffer circuit 35 and of the circulation counter circuit 36 are made larger in size than those of the latch and encoder circuit 32, the circulation counter circuit 36 and the latch circuit 38. This is done in order to ensure that accurately identical amounts of delay will be produced by the drive buffer circuit 35 and delay buffer circuit 37 respectively, i.e., to ensure that the respective amounts of delay produced by the CMOS inverters within the drive. buffer circuit 35 and the delay buffer circuit 37 will not vary as a result of manufacturing defects and adhering dust particles.

Specific configurations for the transistors used to constitute the CMOS inverters in the pulse delay circuit 30, the drive buffer circuit 35 and the delay buffer circuit 37 can be as described hereinabove for the first embodiment.

With the A/D converter 3 of this embodiment, due to the fact that the circulation counter circuit 36 counts the number of circulations of the pulse signal Pin around the ring-configuration delay line formed in the pulse delay circuit 30, during a sampling interval, the number of delay units (number of delay stages) required for the pulse delay circuit 30 can be substantially reduced.

Furthermore since the size of the transistors constituting the drive buffer circuit 35 and the delay buffer circuit 37 are of larger size than the transistors of the latch and encoder circuit 32, circulation counter circuit 36 and latch circuit 38, manufacturing defects and adhering dust particles will result in only small variations in the IC patterns of the gate electrodes of the transistors in the drive buffer circuit 35 and delay buffer circuit 37, i.e., there will be only small deviations from the design pattern. Hence the delay characteristics of the drive buffer circuit 35 and delay buffer circuit 37 will conform to the design characteristics.

In addition since the delay units of the pulse delay circuit 30 have uniform delay characteristics, the A/D converter 3 will have stable operation with only small variations in the conversion resolution and hence only a small degree of differential non-linearity. Furthermore since the respective amounts of delay produced by the drive buffer circuit 35 and delay buffer circuit 37 can be accurately matched, the high-order bits of each A/D converted value will be correctly coordinated with the low-order bits of that value. In addition, the manufacturing yield can be increased.

Third Embodiment

Figure 5:
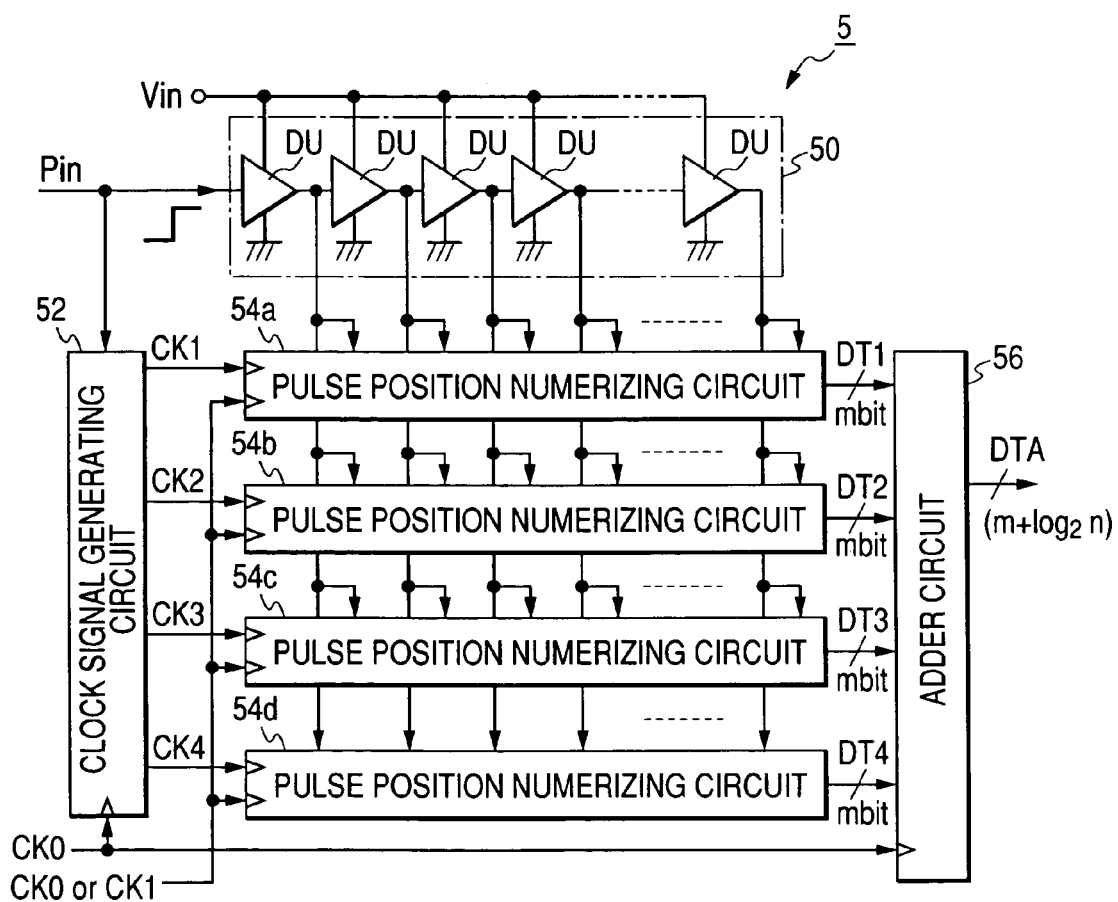
FIG. 5 is a general system block diagram of a third embodiment of an A/D converter, having a plurality of pulse position numerizing circuits.

FIG. 5 shows the general configuration of a third embodiment of an A/D converter, designated by numeral 5. The A/D converter 5 includes a pulse delay circuit 50 which corresponds in configuration and function to the pulse delay circuit 10 of the first embodiment. However with the third embodiment, the number M of delay units DU is made equal to $2^m$, where m is a positive integer.

In place of the latch and encoder circuit 12 of the first embodiment, the A/D converter 5 includes a sampling clock signal generating circuit 52 (referred to in the following simply as a clock signal generating circuit), an adder circuit 56, and a set of four pulse position numerizing circuits 54a, 54b, 54c, 54d which are each of identical configuration. The clock signal generating circuit 52 generates a set of four sampling clock signals CK1, CK2, CK3 and CK4 which are respectively supplied to the pulse position numerizing circuits 54a, 54b, 54c, 54d and which respectively differ in phase. It should be noted that the number of pulse position numerizing circuits, with their corresponding sampling clock signals, can be other than four. Each of the pulse position numerizing circuits performs a basically similar function to that of the latch and encoder circuit 12 of the first embodiment, however with this embodiment, respective numeric values produced by the pulse position numerizing circuits in each A/D conversion operation are combined in the adder circuit 56 to obtain a final output numeric value, and the pulse position numerizing circuits operate with respectively different sampling interval durations as described in the following.

Figure 6A:
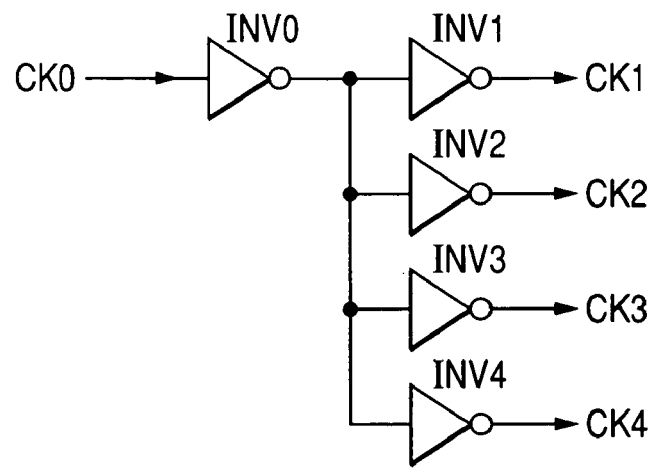
FIG. 6A shows the basic circuit configuration of a clock signal generating circuit of the third embodiment, for supplying respective sampling clock signals to the pulse position numerizing circuits.
Figure 6B:
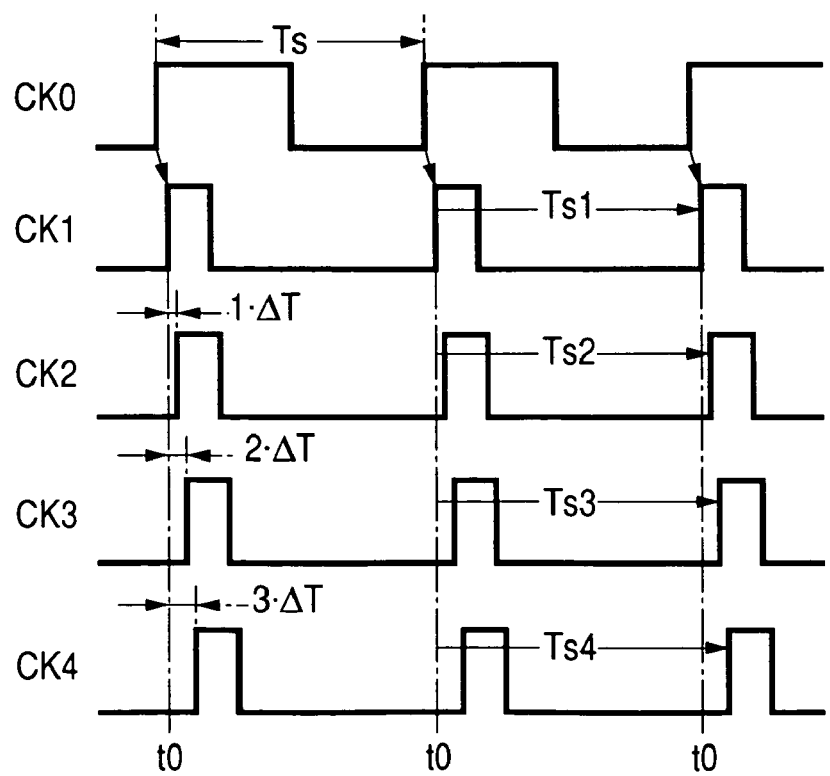
FIG. 6B is a timing diagram showing respective measurement intervals of the pulse position numerizing circuits of the third embodiment.
Figure 7:
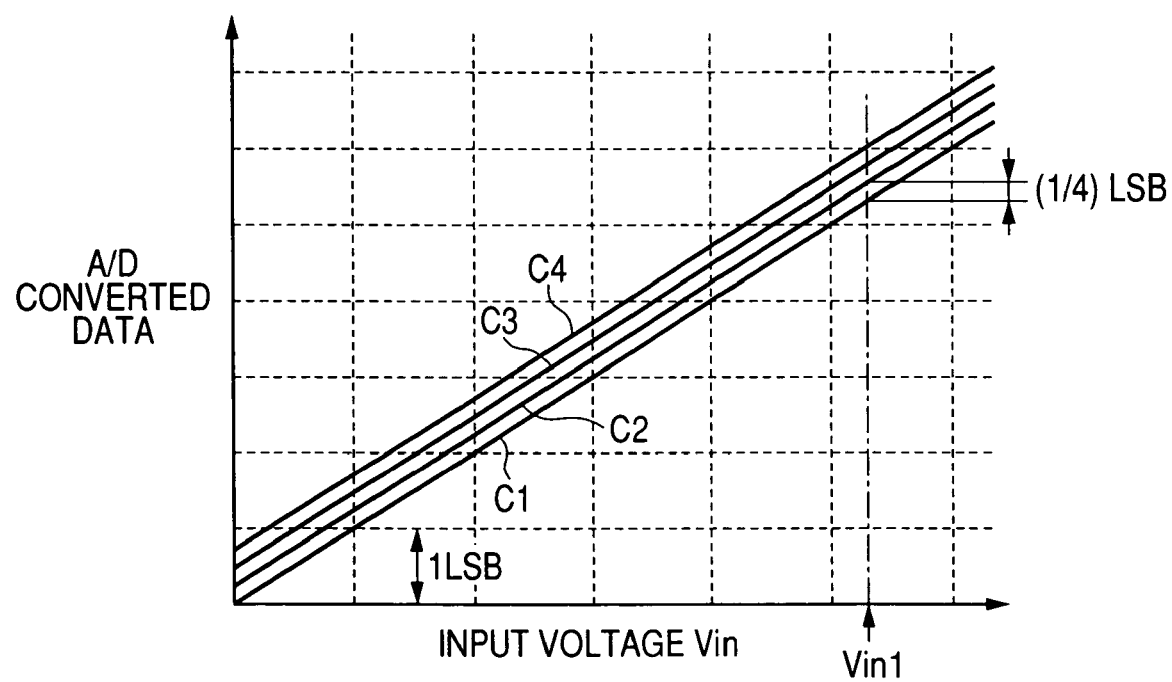
FIG. 7 shows graphs for illustrating the manner in which A/D conversion resolution is increased by utilizing a plurality of pulse position numerizing circuits, with the third embodiment.

The basic circuit of the clock signal generating circuit 52 is shown in FIG. 6A, and the phase relationships of the sampling clock signal CK1 to CK4 are shown in the timing diagram of FIG. 6B. As shown the clock signal generating circuit 52 operates from an externally supplied reference clock signal CK0, with one period of that signal designated as a reference sampling interval Ts.

As illustrated in FIG. 6B, the pulse position numerizing circuits 54a to 54d have respectively different sampling intervals Ts1 to Ts4, each beginning at a common start timing t0. At the end of the corresponding sampling interval, each pulse position numerizing circuit derives a numeric value DTn (where n is from 1 to 4 with this embodiment) indicating the total number of delay stages traversed by the pulse signal Pin in the pulse delay circuit 50 up to that time point. Each numeric value DTn is obtained as m bits, and these are summed in the adder circuit 56 to obtain a final numeric value having (m+log$_2$n) bits, as an output digital numeric value, to constitute the output data DT.

Referring again to FIG. 6A, the clock signal generating circuit 52 includes an input-stage inverter INV0 which receives the reference clock signal CK0, and four output-stage inverters INV1 to INV4 each of which receives the output from the inverter INV0 and which respectively produce the sampling clock signals CK1, CK2, CK3 and CK4. Designating the delay time of a delay unit DU under the current level of the converter input voltage Vin as the unit delay amount Td, the sampling clock signals CKn respectively differ in phase by amounts that differ by a multiple of ΔT, where ΔT=Td/n as shown in FIG. 6B. Specifically, the sampling clock signals CK2, CK3 and CK4 are respectively delayed in phase with respect to the sampling clock signal CK1 by the amounts ΔT, 2ΔT, and 3ΔT, where ΔT is Td/4. As described hereinafter, this is achieved by appropriately forming the transistors that constitute the inverters of the clock signal generating circuit 52.

Figure 8:
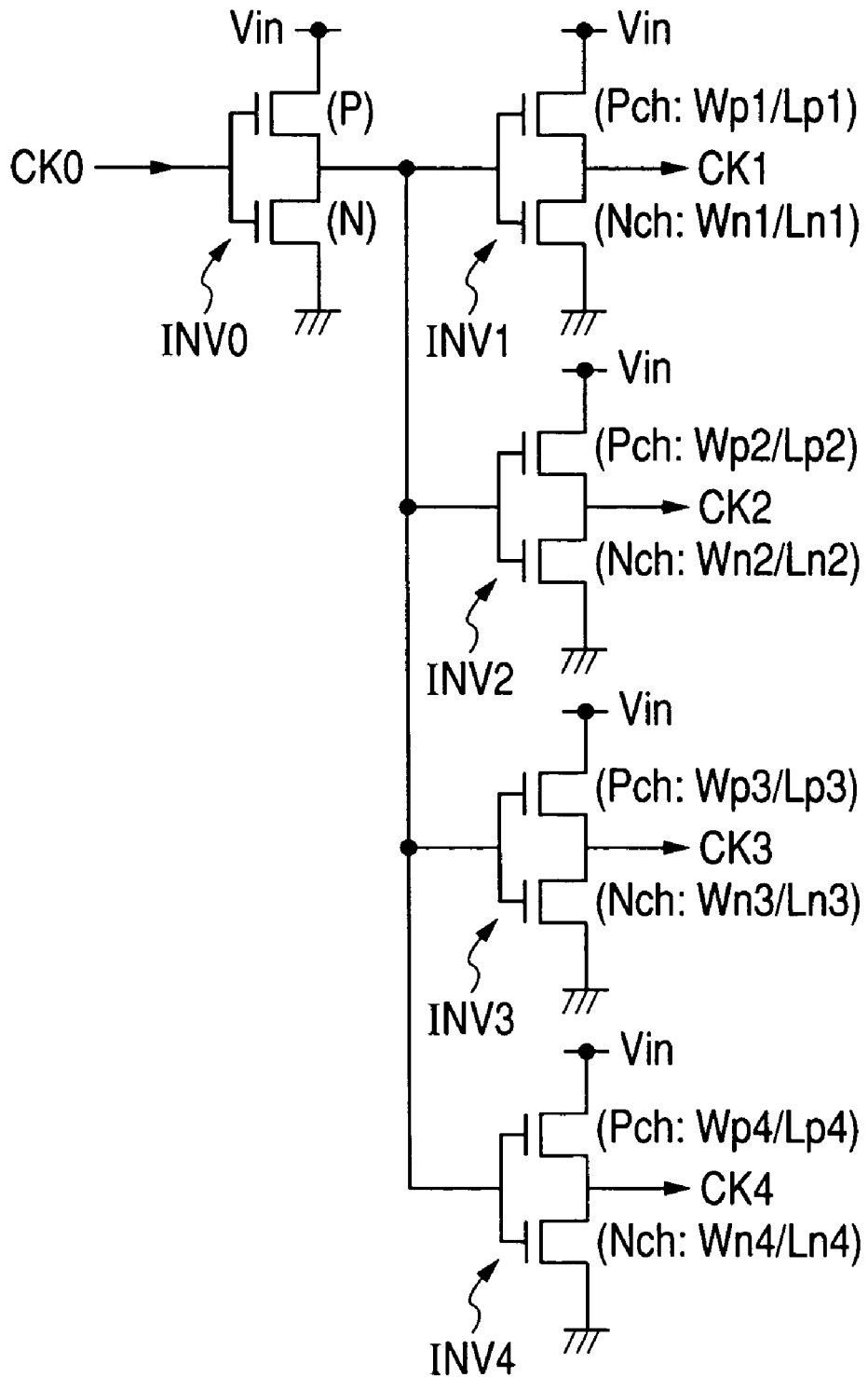
FIG. 8 is a detailed circuit diagram of the clock signal generating circuit of the third embodiment.

Since the value of the unit delay time Td varies with the level of the converter input voltage Vin, the converter input voltage Vin is applied as the supply voltage of the clock signal generating circuit 52, as shown in FIG. 8, which shows a specific configuration for the clock signal generating circuit 52.

Figure 9:
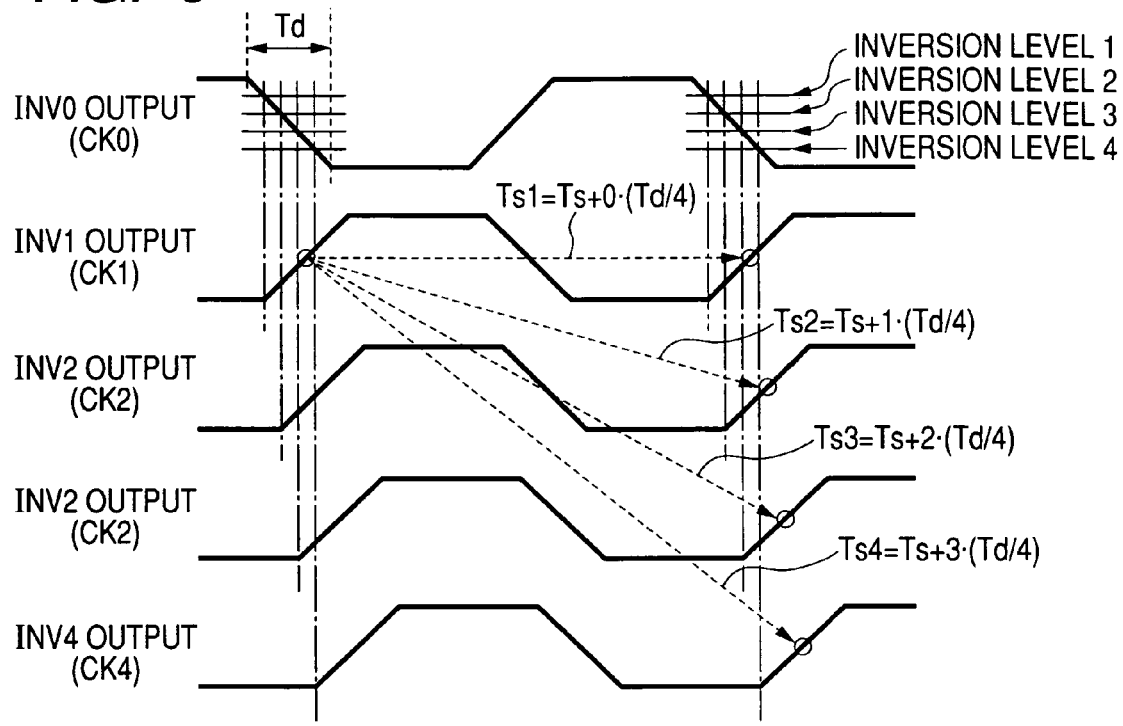
FIG. 9 is a timing diagram for use in describing the operation of the third embodiment.

In FIG. 8, each inverter is a CMOS inverter, which can be configured as described for the inverters of the preceding embodiments. However with this embodiment, the sizes of the respective transistors utilized in the output-stage inverters INV1 to INV4 are adjusted such as to provide the relationship shown in the waveform diagram of FIG. 9 between delays of the respective output signals from the inverters. That is to say, the latter delays determine the amounts by which the sampling intervals Ts1 to Ts4 shown in FIG. 9 are of successively increased duration.

Specifically, designating an output stage inverter as INVi (where i is from 1 to 4 with this embodiment), the length Lp and width Wp of the gate electrode of the P-channel FET and the length Ln and width Wn of the gate electrode of the N-channel FET of inverter INVi, which receives a sampling clock signal CKi, are each set to appropriate values, i.e., the respective sizes of the P-channel FET and N-channel FET are set appropriately to provide a required amount of delay for the inverter in relation to the other output stage inverters.

These varying transistor dimension values are illustrated in FIG. 8, respectively indicated for example as Wp1, Lp1 for the transistor width and transistor length dimensions of the P-channel FET of the inverter which produces sampling clock signal CK1, and Wn1, Ln1 for the transistor width and transistor length dimensions of the N-channel FET of that inverter.

As shown in FIG. 6B, with the start of each period of the sampling clock signal CK1 used as the common start timing t0, and as a result of the successive phase shifts of ΔT, 2ΔT, and 3ΔT of the sampling clock signals CK2 to CK4 with respect to CK1, the sampling intervals Ts1 to Ts4 corresponding to the sampling clock signals CK1 to CK4 (more specifically, corresponding to respective ones of the pulse position numerizing circuits 54a to 54b) successively increase in duration in increments of ΔT.

It is assumed that with this embodiment, the common start timings t0 are defined by the sampling clock signal CK1. However as indicated in FIG. 5, it would be equally possible for the reference clock signal CK0 to be supplied to each of the pulse position numerizing circuits, for defining the common start timings t0, in place of the sampling clock signal CK1.

With this embodiment, the end of each of the respective sampling intervals of the pulse position numerizing circuits (i.e., the point at which the position attained by the pulse signal Pin along the delay units of the pulse delay circuit 50 is detected and expressed as a numeric value) corresponds to a rising edge of the corresponding sampling clock signal CKi however it would be equally possible for that point to correspond to a falling edge of that sampling clock signal.

It should be noted that even when the level of the converter input voltage Vin is constant, respectively different numeric values will be generated by the pulse position numerizing circuits 54a to 54b in each conversion operation. This is due to the fact that since the sampling intervals Tsi respectively differ by the unit delay amount ΔT, the numeric values Dti (where i is in the range 1 to 4 with this embodiment) produced by the pulse position numerizing circuits (at any specific level of the converter input voltage Vin) are respectively shifted by the amount Vd/n, where Vd is an amount of voltage corresponding to one LSB (least significant bit) of a numeric value DTi. As a result, with the numeric values DT1 to DTn being added together by the adder circuit 56, the resultant output value DTA will be increased by an amount equal to 1 LSB each time the level of the converter input voltage Vin increases by the amount Vd/n.

This is illustrated by FIG. 6, in which C1, C2, C3, C4 respectively designate the A/D conversion characteristics of the individual pulse position numerizing circuits 54a to 54c. As shown, with the converter input voltage Vin at a specific level Vin1, due to the respective differences between the sampling interval durations of the pulse position numerizing circuits, the respective numeric values produced by the pulse position numerizing circuits 54a to 54c will successively differ from one another in increments equivalent to ¼ of an LSB of a single pulse position numerizing circuit, i.e., ¼ of the quantization step size of a single pulse position numerizing circuit.

As a result of deriving each converted output value of the data DTA by summing the output values from n pulse position numerizing circuits, the A/D conversion resolution is increased by $\log_2 n$, by comparison with the first embodiment, without increasing the number of delay units.

Furthermore, the dynamic range of the data DTA thus obtained from the adder circuit 56 is n times the dynamic range of the data Dti generated by a single one of the pulse position numerizing circuits.

The A/D converter 5 of this embodiment is implemented on an IC chip using the CMOS manufacturing process, in the same manner as for the first embodiment. The transistors constituting the pulse position numerizing circuits 54a to 54b and the adder circuit 56 are each made as small in size as possible, i.e., formed using the minimum practicable CMOS pattern design rule. The transistors of the pulse delay circuit 50 are made of larger size than those of the pulse position numerizing circuits 54a to 54b and the adder circuit 56, for the same reasons as described above for the first embodiment. However in addition, the transistors of the clock signal generating circuit 52 are made larger in size than those of the pulse position numerizing circuits 54a to 54b and the adder circuit 56. This is done in order to ensure that the respectively different amounts of delay which are produced by the inverters INV1 to INV4 shown in FIG. 8 will be accurately determined, i.e., to ensure that the relationships between the amounts of delay produced by these CMOS inverters will not vary from the design values due to the effects of manufacturing defects, etc.

The patterns of the transistors of the pulse delay circuit 50 and of the clock signal generating circuit 52 of this embodiment can be as shown in FIG. 2A or FIG. 3A, of the first embodiment above.

With the A/D converter 5 of this embodiment, the plurality of pulse position numerizing circuits 54a to 54b perform A/D conversion substantially concurrently, and the results thereby obtained are appropriately combined to achieve A/D converted data having a high degree of resolution, without requiring an increase in the duration of the measurement interval (i.e., sampling interval) or an increase in the number of delay units. Hence, A/D conversion can be rapidly performed, with high resolution.

As described above, the transistors of the pulse delay circuit 50 and the clock signal generating circuit 52 are larger than those of other circuit sections (specifically, the pulse position numerizing circuits 54a to 54b and the adder circuit 56) so that the size of the gate area in each of the transistors of the pulse delay circuit 50 and the clock signal generating circuit 52 can be made sufficiently large. That is to say, even if the actual (effective) sizes of the gate areas vary due to the effects of manufacturing defects and adhering dust particles, the desired operating characteristics can be achieved for the transistors.

Hence, in addition to providing uniformity of the respective amounts of delay produced by the delay units DU at any particular level of the converter input voltage Vin, it can be ensured that the respective measurement intervals of the pulse position numerizing circuits 54a to 54b will successively differ by the specified integral multiples of ΔT. Hence, the resolution of the output data that are obtained by adding together the numeric values produced by the pulse position numerizing circuits 54a to 54b can be optimized, and the A/D converter 5 can have stable conversion characteristics with only a small level of differential non-linearity. In addition, the manufacturing yield of the ICs in which the A/D converter 5 is implemented can be high.

This embodiment has been described for the case in which the number n of pulse position numerizing circuits is 4, however it would be equally possible to utilize a greater number of pulse position numerizing circuits.

Furthermore for ease of description, the number of delay units DU has been specified as $M=2^m$, where m is a positive integer. However it would be possible to use other values for the number of delay units.

Fourth Embodiment

Figure 10:
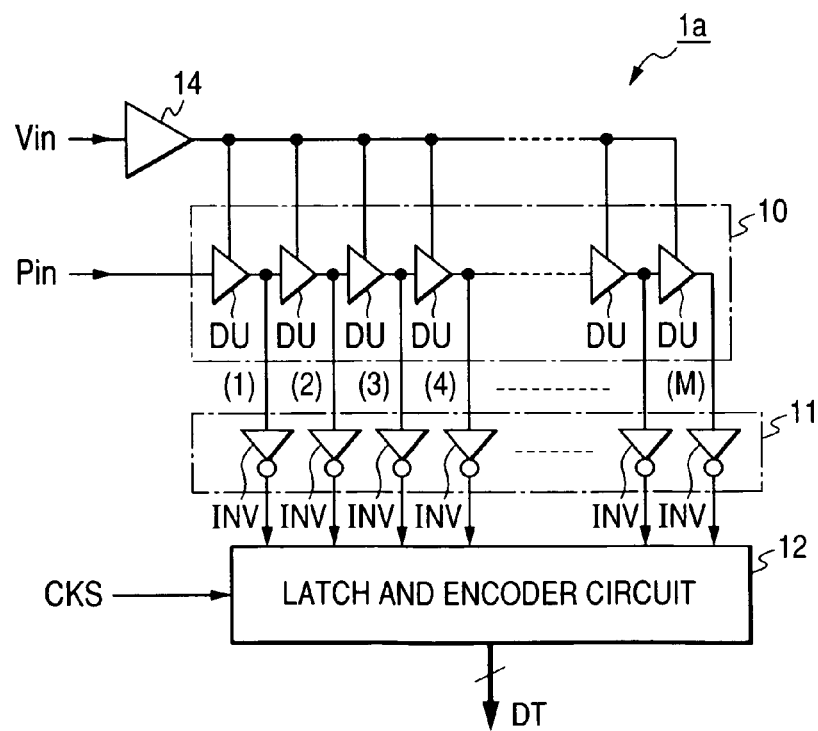
FIG. 10 is a general system block diagram of a fourth embodiment of an A/D converter, in which a set of buffer circuits are inserted between a pulse delay circuit and a latch/encoder circuit of the first embodiment.

FIG. 10 shows the general configuration of a fourth embodiment of an A/D converter, designated as 1a. This differs from the A/D converter 1 of the first embodiment in that a buffer circuit set 11 is disposed between the pulse delay circuit 10 and the latch and encoder circuit 12. The buffer circuit set 11 contains an identical number of inverters to the number of delay units DU of the pulse delay circuit 10, with each inverter INV in the buffer circuit set 11 connected between an output terminal of a corresponding one of the delay units DU and a corresponding input terminal of the latch and encoder circuit 12, to act as a buffer circuit.

With this embodiment, in addition to the transistors of the pulse delay circuit 10 being made larger than those of the latch and encoder circuit 12, the transistors of the buffer circuit set 11 are also made larger than those of the latch and encoder circuit 12. However the size of each transistor of the buffer circuit set 11 is made intermediate between the size of each transistor of the pulse delay circuit 10 and that of each transistor of the latch and encoder circuit 12 (i.e., the size of each P-channel FET of the buffer circuit set 11 being intermediate between that of each P-channel FET of the pulse delay circuit 10 and that of each P-channel FET of the latch and encoder circuit 12, and the size of each N-channel FET of the buffer circuit set 11 being intermediate between that of each N-channel FET of the pulse delay circuit 10 and that of each N-channel FET of the latch and encoder circuit 12).

The inverters of the buffer circuit set 11 serve to reduce the effects of a difference between the switching levels of the inverters of the pulse delay circuit 10 and the switching levels of the inverters of the latch and encoder circuit 12, i.e., a difference that results from the respectively different sizes of the transistors that constitute the inverters of the pulse delay circuit 10 and the transistors of the latch and encoder circuit 12. In addition, the incorporation of the inverters of the buffer circuit set 11 serves to absorb the effects of changes in the aforementioned difference in switching levels that may occur due to long-term drift of the transistor characteristics.

As a result, irrespective of changes in the operating conditions (e.g., changes in the range of variation of the converter input voltage Vin, variations between the respective threshold voltages of the transistors, changes in the threshold voltages of the transistors, changes in operating temperature, etc., the position of the delayed pulse can be substantially accurately determined by the latching operation of the latch and encoder circuit 12 in each measurement interval, so that stable operation of the A/D converter 1a can be achieved.

Fifth Embodiment

Figure 11:
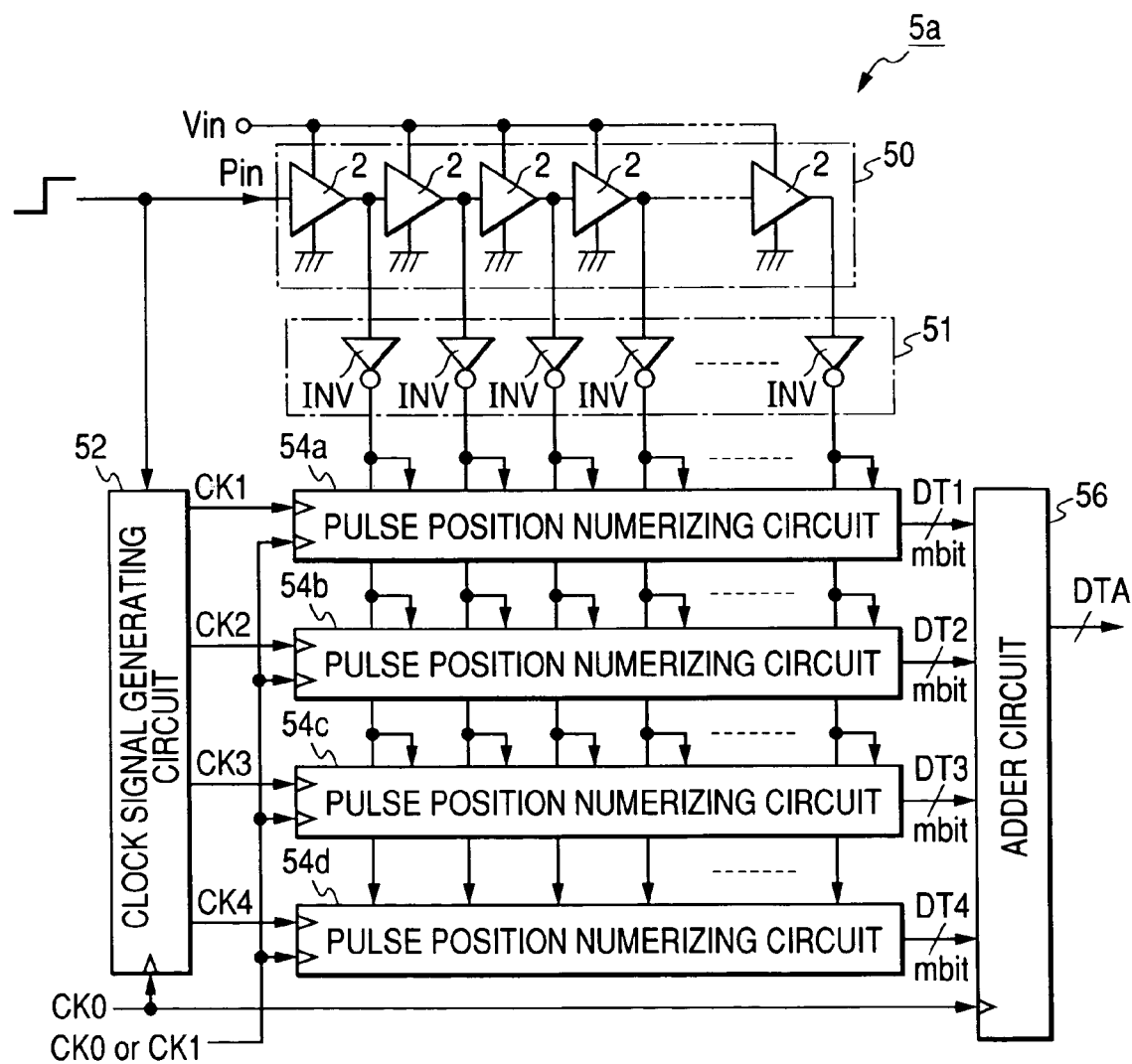
FIG. 11 is a general system block diagram of a fifth embodiment of an A/D converter, in which a set of buffer circuits are inserted between a pulse delay circuit and each of the pulse position numerizing circuits of the third embodiment.

The third embodiment can be modified as shown in the overall configuration of a fifth embodiment 5a in FIG. 11, by inserting a buffer circuit set 51 between the pulse delay circuit 50 and each of the pulse position numerizing circuits 54a to 54c. Specifically, the buffer circuit set 51 is made up of a set of inverters INV which function as respective buffer circuits, with each inverter connected between an output terminal of a corresponding one of the delay units DU and a corresponding input terminal of each of the pulse position numerizing circuits 54a to 54d.

In that case, even if the number of pulse position numerizing circuits is increased, so that the amount of capacitance that must be driven to supply the delayed pulse from the pulse delay circuit 50 via a supply lead to each of the pulse position numerizing circuits is increased accordingly, the buffer circuit set 51 can have sufficient drive capability to ensure stable operation, i.e., to ensure that identical amounts of delay are produced by the inverters of the buffer circuit set 51. Differential non-linearity of the A/D conversion operation, due to differences between these respective amounts of delay, can thereby be avoided.

To achieve this, the transistors constituting the buffer circuit set 51 are made of larger size than those of the pulse position numerizing circuits, e.g., can be made intermediate in size between the transistors of the pulse delay circuit 50 and those of the pulse position numerizing circuits, as described for the fourth embodiment above.

Alternative Embodiments

It should be noted that the invention is not limited to the embodiments described above, and that various alternative configurations of the embodiments, or combinations of respective features of embodiments, could be envisaged that fall within the scope claimed for the invention in the appended claims.

Figure 12A:
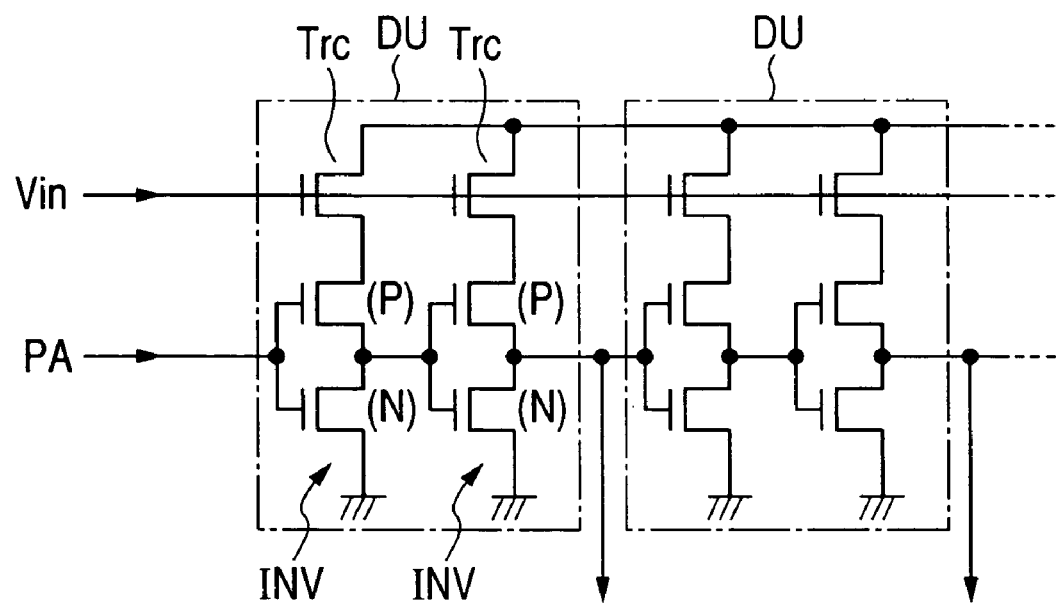
FIG. 12A is a circuit diagram showing an alternative arrangement for applying an converter input voltage to determine respective delays of the delay units.

For example, it is not essential that the converter input voltage Vin be applied as a supply voltage across the inverters in each of the delay units as shown in FIG. 1B above. An alternative arrangement for applying the converter input voltage Vin is illustrated in the partial circuit diagram of FIG. 12A. In this case, a control transistor Trc is connected in series with a corresponding one of the inverters INV of the delay units of a pulse delay circuit such as the pulse delay circuit 10, and the converter input voltage Vin is applied as a control input to the gate electrode of the control transistor.

Figure 12B:
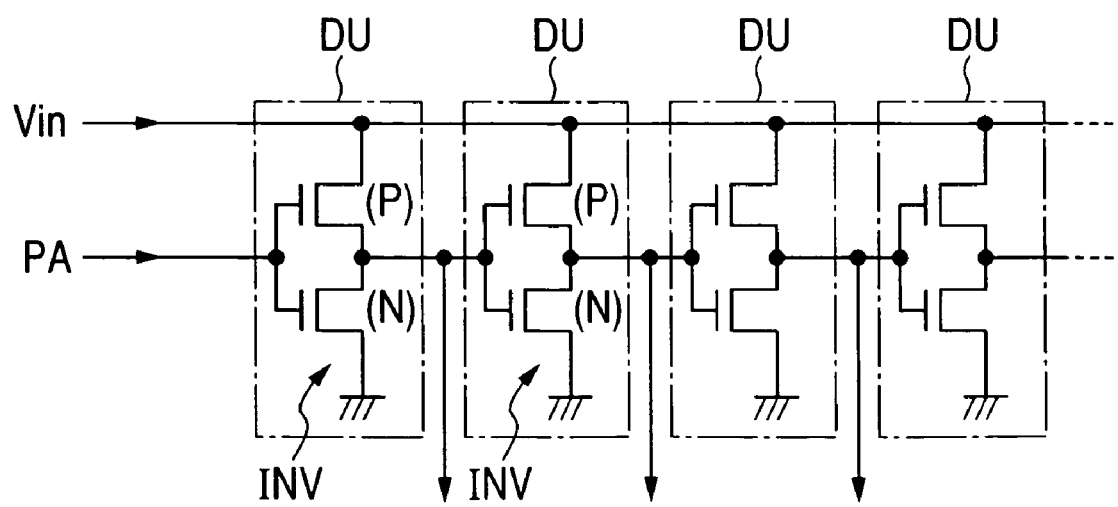
FIG. 12B is a circuit diagram showing delay units that are each formed of a single CMOS inverter.
Figure 13C:
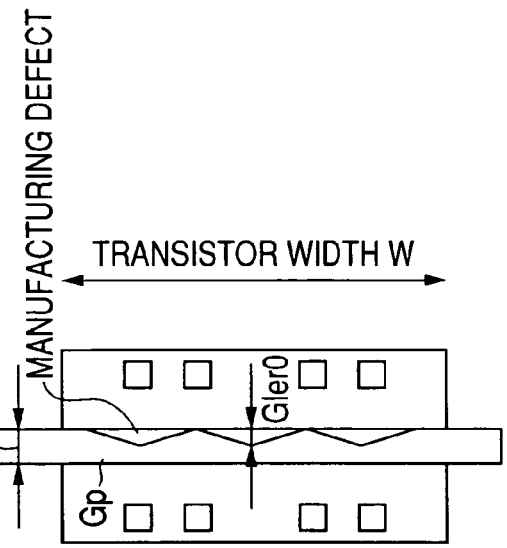
FIGS. 13A, 13B, 13C are diagrams of transistor patterns formed in a CMOS IC, for describing a problem to be overcome by the invention.
Figure 13B:
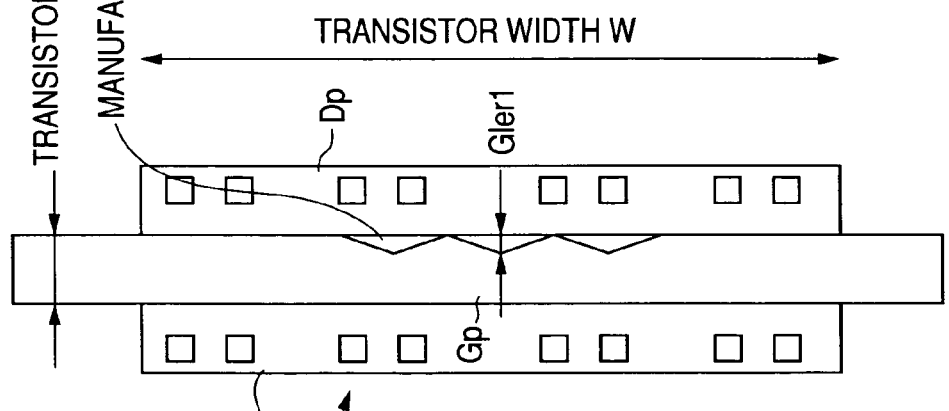
Figure 13A:
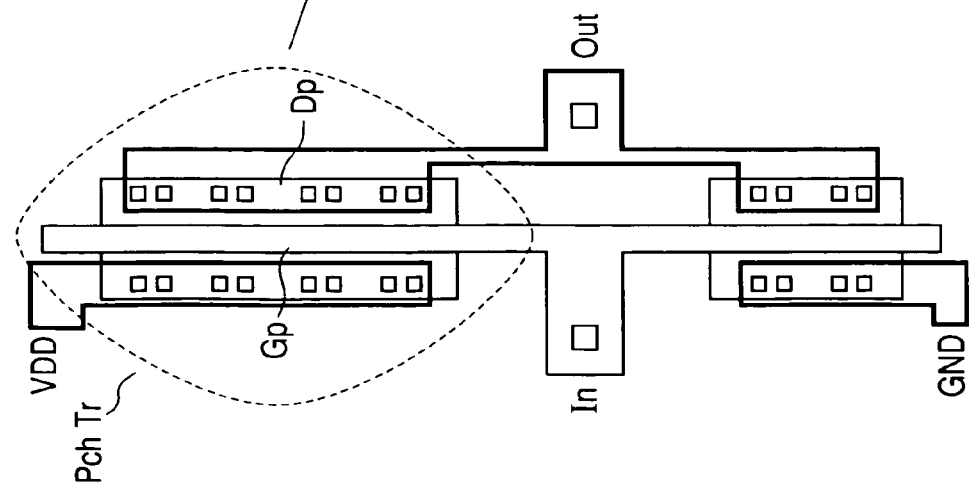
Figure 14A:
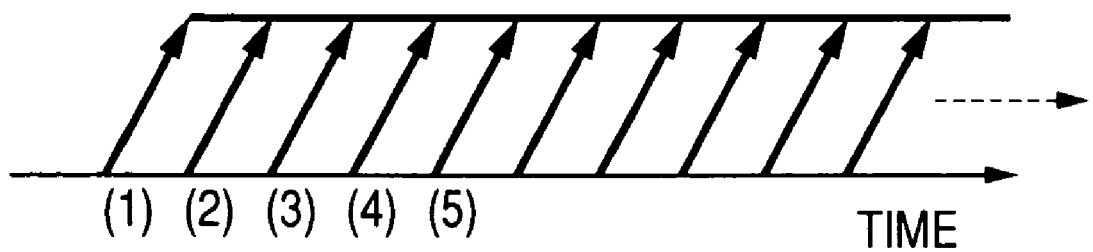
FIGS. 14A, 14B are conceptual timing diagrams, for further describing a problem to be overcome by the invention.
Figure 14B:
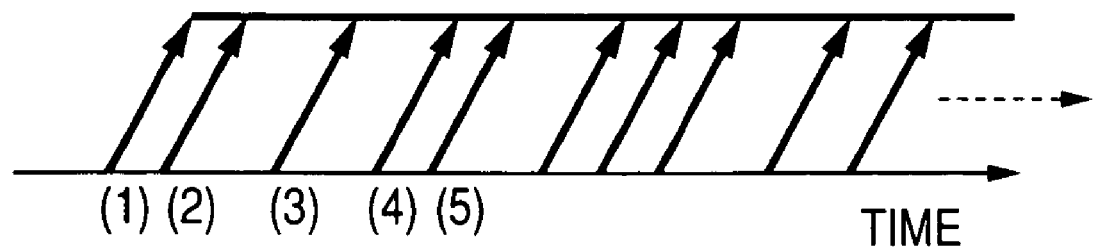

More specifically in the example of FIG. 12, with each inverter formed of a CMOS P-channel FET and N-channel FET pair, each control transistor Trc is connected between a (positive) DC supply voltage (not shown in the drawings) and the drain electrode of the P-channel FET of the corresponding CMOS inverter. In that way the level of current passing through each inverter, and hence the amount of delay produced by each inverter, is controlled in accordance with the level of the converter input voltage Vin (specifically, varies in inverse proportion to that voltage level), so that similar operation to that of the preceding embodiments can be obtained.

Furthermore, the number of inverters constituting each delay unit is not limited to the examples shown. Each delay unit may be formed of a single CMOS inverter as in the example shown in FIG. 12B, or formed of three or more series-connected inverters.

What is claimed is:

1. An A/D (analog-to-digital) converter for repetitively converting a level of a converter input voltage to an output digital numeric value in successive measurement intervals, said A/D converter comprising:

a pulse delay circuit comprising a plurality of delay units connected as successive delay stages, with a first-stage one of said delay units receiving an externally supplied pulse signal at commencement of each of said measurement intervals, with said converter input voltage being applied to control each of said delay units, and each of said delay units transferring said pulse signal with an amount of delay that varies in accordance with said level of the converter input voltage, and encoder circuit means coupled to receive respective outputs of said delay units, for detecting a total number of said delay stages that have been traversed by said pulse signal up to the end of said measurement interval and for deriving from said total number at least a set of low-order bits of said output digital value, each of said pulse delay circuit and said encoder circuit means comprising a plurality of transistors;

wherein at each of respective values of said converter input voltage level, said delay units uniformly produce a corresponding predetermined amount of delay, and each of the transistors of said pulse delay circuit is formed with a larger size than transistors constituting specific other sections of the A/D converter, said specific other sections including at least a part of said encoder circuit means.

2. An A/D converter according to claim 1, wherein each of said transistors is a field effect transistor, and wherein a size of a gate electrode area in each transistor of said pulse delay circuit is larger than that of each transistor of said specific other sections.

3. An A/D converter according to claim 1, wherein each of said delay units comprises one or more CMOS FET (complementary metal oxide semiconductor field effect) inverters, and wherein each of respective P-channel FETs of said inverters of said delay units is formed with an area of gate electrode that is larger than that of respective P-channel FETs of said specific other sections and each of respective N-channel FETs of said inverters of said delay units is formed with an area of gate electrode that is larger than that of respective N-channel FETs of said specific other sections.

4. An A/D converter according to claim 1, wherein said pulse delay circuit is configured as a ring delay line, and said A/D converter further comprises a counter circuit having a count input terminal coupled to receive said pulse signal from the output of a specific one of said delay units, for obtaining a count value expressing a number of times that said pulse signal circulates around said pulse delay circuit during said measurement interval, and a counter latch circuit for registering a count value of said counter circuit in response to an externally supplied latch timing signal which is produced at termination of said measurement interval, and for deriving a set of high-order bits of said output digital numeric value from said count value;

wherein said A/D converter further comprises a first buffer circuit for transferring said pulse signal from said specific one of the delay units to said count input terminal of said counter circuit, and a second buffer circuit for transferring said latch timing signal to said counter latch circuit, said first buffer circuit and said second buffer circuit have substantially identical predetermined values of signal transmission delay, and each of respective transistors constituting said first buffer circuit and said second buffer circuit is formed with a larger size than transistors constituting specific other sections of the A/D converter, said specific other sections comprising at least a part of said encoder circuit means.

5. An A/D converter according to claim 1, wherein said encoder circuit means comprises a sampling clock signal generating circuit, controlled by said converter input voltage for generating n sampling clock signals which respectively differ in phase from one another by an amount equal to 1/n times an amount of delay that is currently being applied by each of said delay units, where n is an integer of value 2 or greater, n pulse position numerizing circuits each coupled to said pulse delay circuit and operating in each of successive A/D conversion operations to derive a numeric value expressing a total number of said delay stages that are traversed by said pulse signal during a measurement interval corresponding to said pulse position numerizing circuit, with the duration of said corresponding measurement interval determined by a corresponding one of said sampling clock signals, and with respective corresponding measurement intervals of said pulse position numerizing circuits successively differing in duration by 1/n times said amount of delay of each of said delay units, and adder circuit means for adding together respective numeric values derived by said pulse position numerizing circuits, and for deriving said bits of said output digital numeric value from a result of said addition;

wherein each of respective transistors constituting said sampling clock signal generating circuit is formed with a larger size than transistors constituting other parts of said encoder circuit means.

6. An A/D converter according to claim 5, wherein said sampling clock signal generating circuit comprises n CMOS FET (complementary metal oxide semiconductor field effect) inverters which receive in common a reference clock signal and respectively produce said n sampling clock signals, and at least one of a transistor length dimension and a transistor width dimension of each transistor of each of said inverters is predetermined for producing a specific amount of signal transfer delay of said inverter, in accordance with a required amount of phase shift of an output sampling clock signal from said inverter, with respect to said reference clock signal.

7. An A/D converter according to claim 5, wherein said sampling clock signal generating circuit comprises an input-stage CMOS FET (complementary metal oxide semiconductor field effect transistor) inverter having said converter input voltage applied thereto as a supply voltage and having an input terminal coupled to receive an externally supplied clock signal, and n CMOS FET output-stage inverters each having said converter input voltage applied thereto as a supply voltage and each having an input terminal coupled to receive a reference clock signal produced from an output terminal of said input-stage inverter, for producing respective ones of said n sampling clock signals;

wherein at least one of a transistor length dimension and a transistor width dimension of each transistor of each of said inverters is predetermined for producing a specific amount of signal transfer delay of said inverter, in accordance with a required amount of phase shift of said output sampling clock signal from said inverter in relation to said reference clock signal.

8. An A/D converter according to claim 1, comprising a set of buffer circuits each coupled between an output terminal of a corresponding one of said delay units and a corresponding input terminal of said encoder circuit means, for transferring said pulse signal to said encoder circuit means, with each of said buffer circuits having a predetermined level of drive capability.

9. An A/D converter according to claim 8, wherein transistors constituting said buffer circuits are each formed to be larger than said transistors constituting said specific other sections of the A/D converter.

10. An A/D converter according to claim 8, wherein transistors constituting said buffer circuits are each formed to be intermediate in size between said transistors constituting said delay units and said transistors constituting said specific other sections of the A/D converter.

11. An A/D converter according to claim 1, wherein at least one of a width dimension and a length dimension of each of said transistors of said delay units is at least twice as large as that of said transistors constituting said specific other sections of the A/D converter.

12. An A/D converter according to claim 1, wherein each of respective transistors constituting said pulse delay circuit is a field effect transistor having a gate electrode formed with a comb-shaped pattern.

13. An A/D converter according to claim 12, wherein each transistor of said delay units of said pulse delay circuit is one of a pair of transistors of a CMOS FET (complementary metal oxide semiconductor field effect) inverter, and said comb-shaped pattern comprises an elongated spine portion and a plurality of pairs of tooth portions, each pair extending from opposing sides of said spine portion, with one tooth portion of said pair constituting part of a gate electrode of a P-channel FET and the other tooth portion of said pair constituting part of a gate electrode of an N-channel FET.

14. An A/D converter according to claim 1, wherein said A/D converter is formed on an integrated circuit chip and wherein each of said transistors constituting said specific other sections of the A/D converter is formed using a minimum practicable value of design rule.

* * * * *